(12) United States Patent
Chang et al.

(10) Patent No.: US 12,062,581 B2
(45) Date of Patent: *Aug. 13, 2024

(54) DEVICES WITH ADJUSTED FIN PROFILE AND METHODS FOR MANUFACTURING DEVICES WITH ADJUSTED FIN PROFILE

(71) Applicant: TAIWAN SEMICONDUCTOR MANUFACTURING COMPANY, LTD., Hsinchu (TW)

(72) Inventors: Hsiao-Chun Chang, Hukou Township (TW); Guan-Jie Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 174 days.

This patent is subject to a terminal disclaimer.

(21) Appl. No.: 17/582,782

(22) Filed: Jan. 24, 2022

(65) Prior Publication Data
US 2022/0157664 A1  May 19, 2022

Related U.S. Application Data

(63) Continuation of application No. 16/685,835, filed on Nov. 15, 2019, now Pat. No. 11,232,989.
(Continued)

(51) Int. Cl.
*H01L 21/8238* (2006.01)
*H01L 27/092* (2006.01)
(Continued)

(52) U.S. Cl.
CPC ........... *H01L 21/823821* (2013.01); *H01L 21/823807* (2013.01); *H01L 21/823878* (2013.01);
(Continued)

(58) Field of Classification Search
CPC ..... H01L 21/823821; H01L 21/823807; H01L 21/823878; H01L 21/823412;
(Continued)

(56) References Cited

U.S. PATENT DOCUMENTS 9,660,083 B2 * 5/2017 Liu ................ H01L 21/823418
9,728,646 B2   8/2017 Wu et al.
(Continued)

FOREIGN PATENT DOCUMENTS

CN   104641470 A   5/2015
CN   106030814 A   10/2016

OTHER PUBLICATIONS

Non-Final Office Action issued in U.S. Appl. No. 16/685,835, dated Dec. 24, 2020.
(Continued)

*Primary Examiner* — Dale E Page
*Assistant Examiner* — Quovaunda Jefferson
(74) *Attorney, Agent, or Firm* — STUDEBAKER & BRACKETT PC

(57) ABSTRACT

A method of manufacturing a semiconductor device includes disposing two or more fins each having an initial fin profile on a substrate. A sacrificial oxide layer is grown on a first fin and a second fin of the two or more fins. The sacrificial oxide layer of the first and second fins is etched to trim the fin and to generate a next fin profile for the first and second fins. The growing and etching is repeated to trim the first and second fins such that the number of repetitions for the first fin and the second fin are different. Gate structures are formed over the two or more fins.

20 Claims, 15 Drawing Sheets

Related U.S. Application Data

(60) Provisional application No. 62/774,117, filed on Nov. 30, 2018.

(51) Int. Cl.
*H01L 29/66* (2006.01)
*H01L 29/78* (2006.01)

(52) U.S. Cl.
CPC .... *H01L 27/0924* (2013.01); *H01L 29/66795* (2013.01); *H01L 29/785* (2013.01)

(58) Field of Classification Search
CPC ............. H01L 27/0924; H01L 27/0886; H01L 29/66795; H01L 29/785; H01L 29/66818
See application file for complete search history.

(56) References Cited

U.S. PATENT DOCUMENTS

| | | | |
|---|---|---|---|
| 11,232,989 B2* | 1/2022 | Chang | H01L 29/66795 |
| 2007/0158756 A1 | 7/2007 | Dreeskornfeld | |
| 2008/0283910 A1 | 11/2008 | Dreeskornfeld | |
| 2012/0083127 A1 | 4/2012 | Clark et al. | |
| 2016/0190319 A1* | 6/2016 | Kavalieros | H01L 29/0653 |
| | | | 257/190 |
| 2017/0005090 A1 | 1/2017 | Ando | |
| 2017/0053912 A1 | 2/2017 | Ching et al. | |

OTHER PUBLICATIONS

Final Office Action issued in U.S. Appl. No. 16/685,835, dated Jun. 14, 2021.
Notice of Allowance issued in U.S. Appl. No. 16/685,835, dated Sep. 2, 2021.

* cited by examiner

| FinCD Modulation Result | Fin Profile | Fin top loss | 1% to 2% |
| | | STI top loss | 1% to 2% |
| | | Fin HT | comparable |
| | | ΔFinTCD | 8% to 15% |
| | | ΔFinMCD | 10% to 20% |
| | | ΔFinBCD | 13% to 25% |
| | Wafer Acceptance Tests | ΔVts | +50 to +60 mV |
| | | ΔDIBL | -15 to -20 mV |

DEVICES WITH ADJUSTED FIN PROFILE AND METHODS FOR MANUFACTURING DEVICES WITH ADJUSTED FIN PROFILE

PRIORITY CLAIM AND CROSS-REFERENCE

This application is a Continuation of U.S. patent application Ser. No. 16/685,835 filed on Nov. 15, 2019, now U.S. Pat. No. 11,232,989, which claims priority to U.S. Provisional Application 62/774,117 filed on Nov. 30, 2018, the entire disclosure of the two applications are incorporated herein by reference.

BACKGROUND

Performance of a FinFET devices may be adjusted by modifying a threshold voltage of the FinFET device. One method of adjusting the threshold voltage of the FinFET devices is by doping the channel region of the fin of the FinFET device by ion implantation. There is a need for a method of adjusting the threshold voltage to improve the performance of the FinFET devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
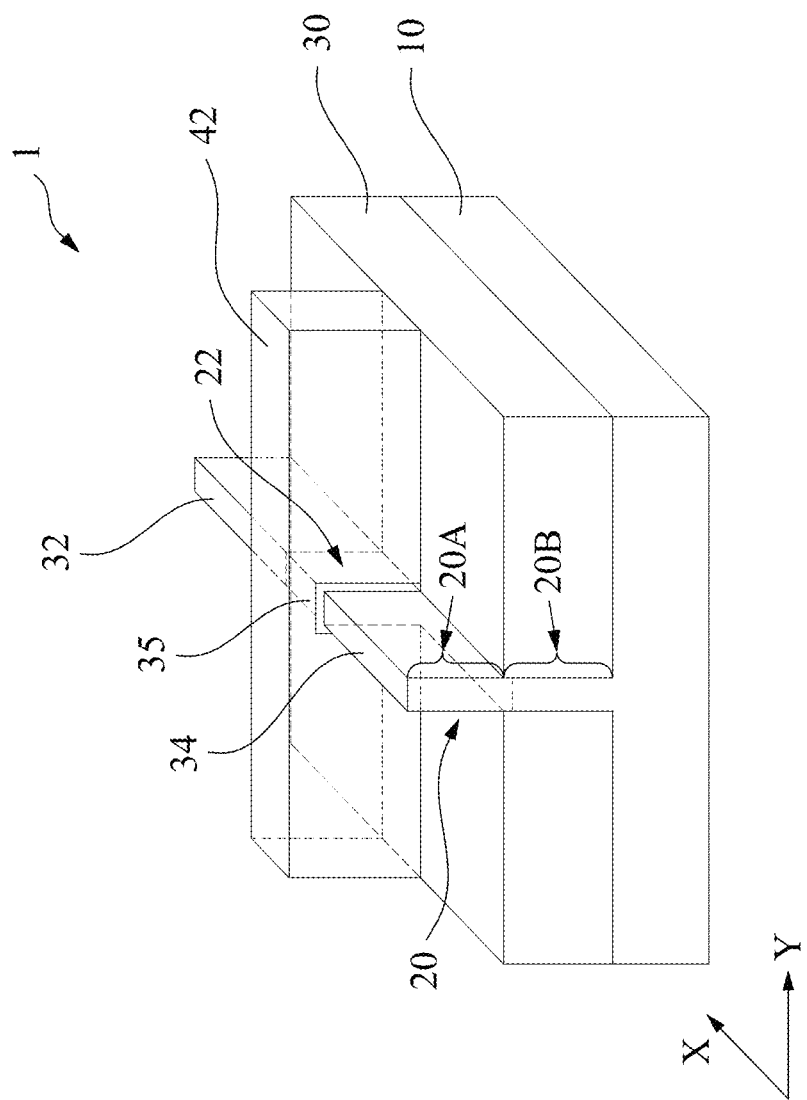
FIG. 1A schematically illustrates a perspective view of an exemplary FinFET device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure relates generally to a process of fabricating fin field-effect transistor (FinFET) devices, and more specifically to a process for adjusting a threshold voltage of the FinFET devices. In semiconductor device manufacturing, ion implantation is used for adjusting the dopant concentration of a fin (a channel region) in a FinFET device to adjust the threshold voltage (Vt) of the FinFET device. The threshold voltage is dependent on the concentration and type (n or p) of the dopant. The threshold voltage of an n-type FinFET device may increase with increasing the dopant concentration of the fin and the threshold voltage of a p-type FinFET device may decrease with increasing the dopant concentration of the fin.

When an ion implantation operation is used to adjust Vt, a layer of oxide, e.g., a gate dielectric layer, is deposited on the channel region of the fin in a middle portion of the fin. In some embodiments, the gate dielectric layer is a thick dielectric layer having a thickness in a range from about 30 nm to about 40 nm suitable for peripheral circuits, input/output (IO) circuits, and thus the thick gate dialectic layer is an IO dielectric layer (e.g., an IO oxide). The channel region is between the source and drain regions of the fin. A resist pattern is formed over the substrate to open target regions subjected to the ion implantation. The ion implantation is performed through the gate dielectric layer in the channel region of the fin. The gate dielectric layer may reduce a damage to the crystalline structure of the fin due to ion implantation. Thus, the gate dielectric layer on the channel region of the fin is a sacrificial layer, in some embodiments. Then, in some embodiments, a sacrificial polysilicon layer, a poly gate, is deposited on the gate dielectric layer, before the source and drain regions of the fin are appropriately doped with impurities, and/or before source and drain epitaxial regions are grown at the two ends of the fin. Finally, the sacrificial gate dielectric layer and sacrificial polysilicon are removed from the middle portion of the fin and a gate dielectric and a gate electrode are deposited on the middle portion of the fin to create the gate contact.

Making the width of the fin of FinFET devices wider (making the critical dimension (CD) larger), increases the on-state current ($I_{on}$) compared to devices with thinner fins. It is also observed that off-state leakage current ($I_{off}$) is substantially increased when the fin has a wider bottom and a narrower top and the increase of the leakage current is mainly attributed to the current near the wider bottom of fin. In some embodiments, the increased leakage current is caused by non-uniform doping across the height of the fin during the ion implantation process. In some embodiments, the non-uniform doping is due to a shadow effect from neighboring fins that prevents the ion beam of the ion implantation from reaching parts of the fin. The present disclosure is directed to a method for manufacturing FinFET devices with various threshold voltages and an improved leakage performance.

In some embodiments, there is a need to reduce the drain-induced barrier lowering (DIBL) and to reduce the leakage current. In some embodiments, the fin profile is trimmed such that the CD of the fin is reduced to adjust the threshold voltage of the resulting FinFET device. For example, in an embodiment, the width of the fin of the FinFET devices is reduced from top to bottom and the fin width is reduced more at the bottom to make the fin sides more vertical to increase the threshold voltage, to reduce the DIBL, and to reduce the leakage current. In some embodiments, one or more regions of the fin 20 is selectively trimmed such that oxidizing and etching are selectively applied to a region, for example, to remove more material of the fin 20 at the bottom than the top. In the present disclosure, a threshold voltage Vt of a FinFET device is adjusted by modifying a profile in shape of the fin channel with or without using an ion implantation operation.

FIG. 1A schematically illustrates a perspective view of an exemplary FinFET device 1 in accordance with some embodiments of the present disclosure. The FinFET device 1 includes, among other features, a substrate 10, a fin 20 (e.g., a fin structure), a gate dielectric layer 35 and a gate electrode 42. In some embodiments, the substrate 10 is a silicon substrate. Alternatively, as will be described below, the substrate 10 may comprise another elementary semiconductor, such as germanium; a compound semiconductor including Group IV-IV compound semiconductors, Group III-V compound semiconductors; or combinations thereof. The fin 20 is disposed over the substrate. The fin 20 may be made of the same material as the substrate 10 and may protrude from the substrate 10. In some embodiments, the fin structure is made of Si. In some examples, substrate 10 is a silicon-on-insulator (SOI) substrate. The fin 20 may be intrinsic and may appropriately be doped with an n-type impurity or a p-type impurity. In some embodiments, source and drain regions 32 and 34 are heavily doped and may contain impurities having a concentration in a range from about $5\times10^{19}$ cm$^{-3}$ to $1\times10^{20}$ cm$^{-3}$, while a channel region 22, e.g., a gate region, is undoped or lightly doped.

A height of the fin 20 includes an upper part 20A and a lower part 20B. The lower part 20B may be embedded in the isolation insulating layer 30, and the upper part 20A of the fin 20 may protrude from the isolation insulating layer 30. A middle portion of the upper part 20A, along a length of the upper part 20A under the gate electrode 42, is the channel region 22 and the two end regions of the upper part 20A are the source and drain regions 32 and 34. In some examples, a fin structure that include two or more fins 20 having two or more channels are formed on substrate 10. A FinFET device having two or more channels is described with respect to FIG. 1B. Spaces between the fins 20 and/or a space between one fin structure and another element formed over the substrate 10 are filled by an isolation insulating layer 30. In some embodiments, isolation insulating layer 30 is a "shallow-trench-isolation (STI)" layer filled with an insulating material. The insulating material for the isolation insulating layer 30 may include silicon oxide, silicon nitride, silicon oxynitride (SiON), SiOCN, fluorine-doped silicate glass (FSG), or a low-k dielectric material or other suitable material.

The channel region 22 of the upper part 20A protruding from the isolation insulating layer 30 is covered by a gate dielectric layer 35, and the gate dielectric layer 35 is further covered by a gate electrode 42. Portions of the upper part 20A not covered by the gate electrode 42, e.g., source and drain regions 32 and 34, function as source and drain of a metal oxide semiconductor field effect transistor (MOSFET).

In certain embodiments, the gate dielectric layer 35 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 42 may be made of one or more layers of suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, or other suitable materials, and/or combinations thereof. In some embodiments, a gate electrode 42 is formed over the channel region 22, and extends to cover sidewalls of the channel region 22 and to cover portions of the isolation insulating layer 30. One or more FinFETs can be fabricated based on the semiconductor fins as shown in FIGS. 1A and 1B.

In some embodiments, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of a combination of two or more of these materials. For an n-type channel FinFET device (the n-channel FinFET device), one or more of TaN, TaAlC, TiN, TiC, Co, TiAl, HfTi, TiSi and TaSi, or any other suitable materials, is used as the work function adjustment layer, and for the p-channel FinFET device, one or more of TiAlC, Al, TiAl, TaN, TaAlC, TiN, TiC and Co, or any other suitable materials, is used as the work function adjustment layer. The work function adjustment layer may be formed separately for the n-channel FinFET device and a p-type channel FinFET device (the p-channel FinFET device), because p-channels may use different metal layers. The use of work function adjustment layers are described in more details with respect to FIGS. 7A-7D.

Source and drain regions 32 and 34 that are also formed in the fin 20 are appropriately doped with impurities in the source and drain regions 32 and 34. In some examples, source and drain regions are not part of the fin 20 but are epitaxially grown at the two ends of the fin 20 using appropriate material. An alloy of Si or Ge and a metal such as Co, Ni, W, Ti or Ta, or any other suitable material may be formed on the source and drain regions to create source and drain contacts.

Figure 1B:
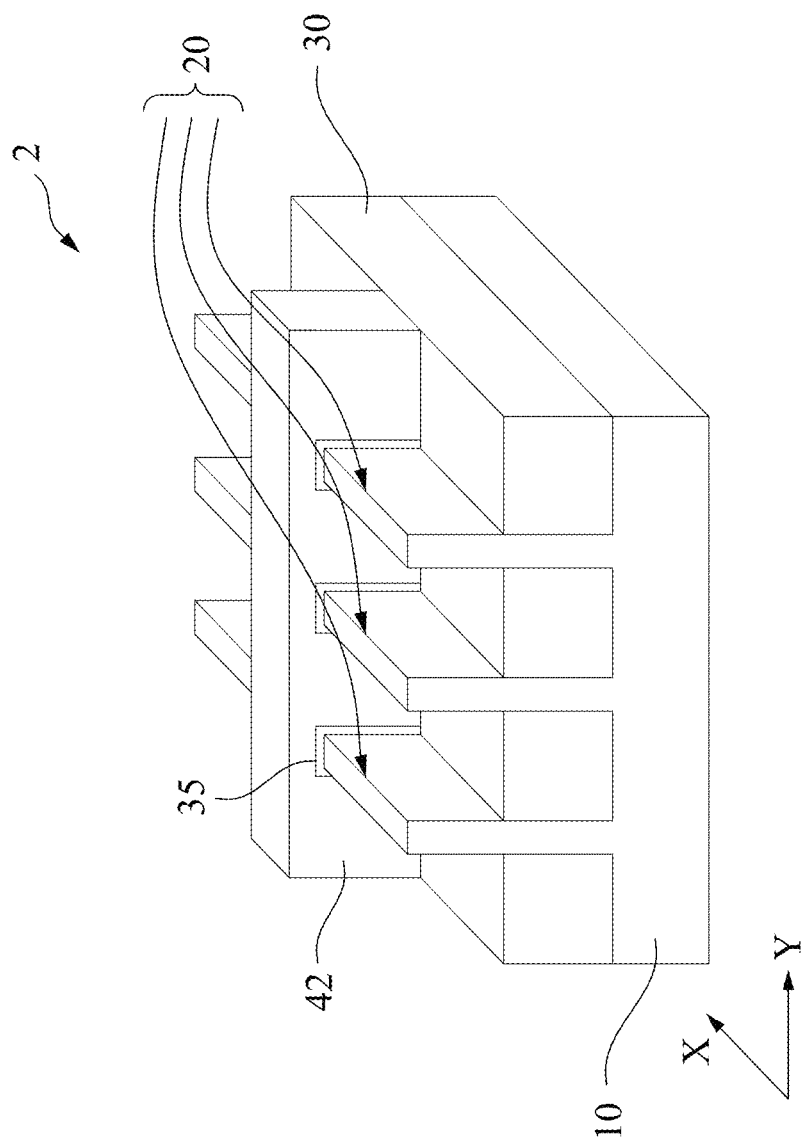
FIG. 1B schematically illustrates a perspective view of an exemplary FinFET device having multiple fins in accordance with some embodiments of the present disclosure.

FIG. 1B schematically illustrates a perspective view of an exemplary FinFET device 2 having multiple fins in accordance with some embodiments of the present disclosure. The FinFET device 2 includes, among other features, substrate 10, two or more, e.g., three fins 20, gate dielectric layer 35 and gate electrode 42 of FinFET device 1 of FIG. 1A. The fins 20 may protrude from the isolation insulating layer 30. In some embodiments, as shown in FIG. 1B, a single dielectric layer, gate dielectric layer 35, and a single gate electrode 42 cover all three fins 20. The number of the fins 20 is not limited to three.

In some embodiments, the configuration of the FinFET device 1 or the configuration of FinFET device 2 is used as an n-type transistor. In some embodiments, the configuration of the FinFET device 1 or the configuration of FinFET device 2 is used as a p-type transistor. The material for forming the gate electrode layers or thicknesses of corresponding portions of the gate electrode layers of the n-type transistors and the p-type transistors may be different, so as to obtain suitable work function levels for the n-type transistors and the p-type transistors, respectively.

FIGS. 2A-2H illustrate various stages of a semiconductor device fabrication process in accordance with some embodiments of the present disclosure. Additional operations can be provided before, during, and after processes shown by FIGS. 2A-2H, and some of the operations described below can be replaced or eliminated, for additional embodiments of the method. The order of the operations/processes may be interchangeable. The operations shown in FIGS. 2A-2H can be used for creating the devices shown in the other figures of the present disclosure.

Figure 2A:
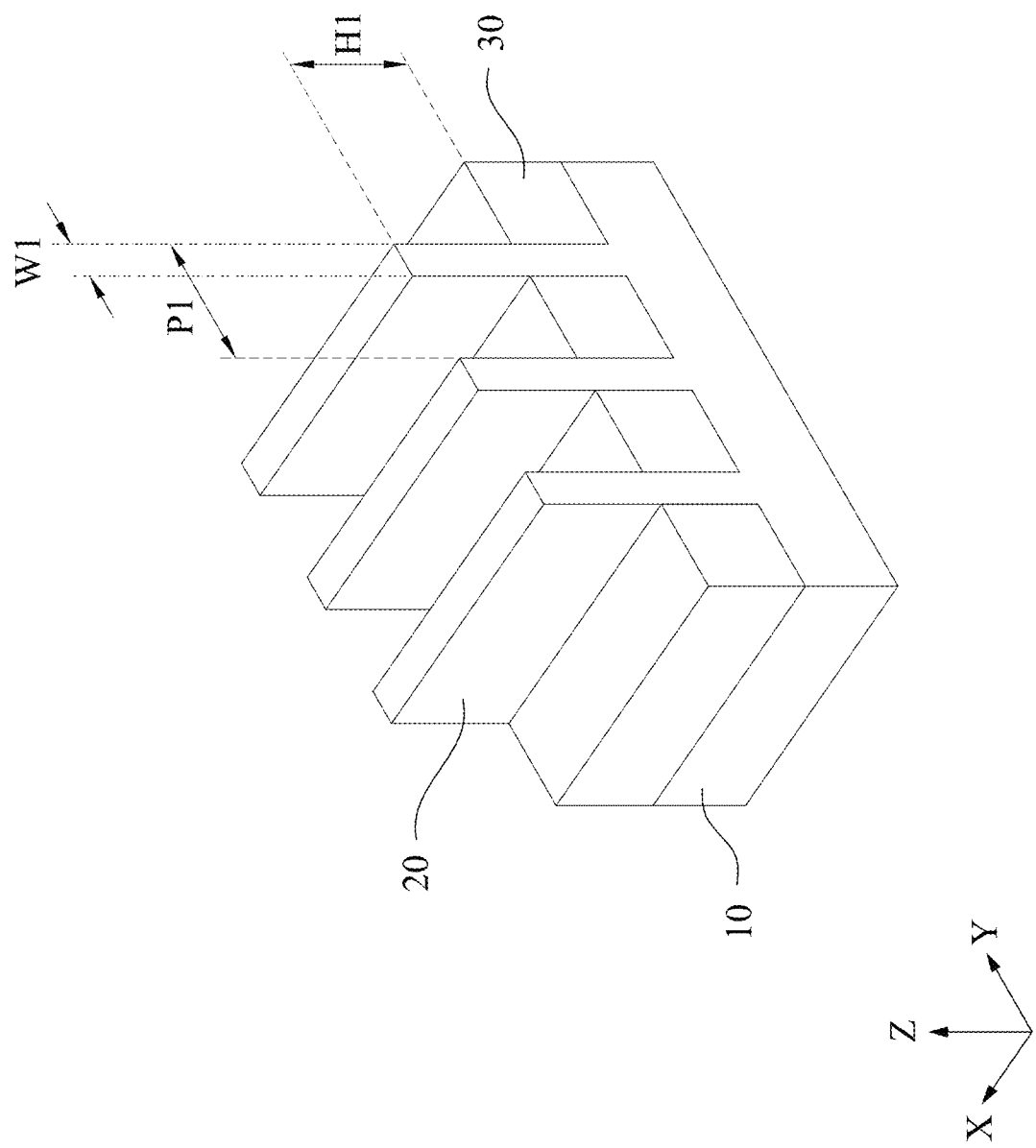
FIG. 2A illustrates one of the various stages of a semiconductor device fabrication process in accordance with some embodiments of the present disclosure.

First, as shown in FIG. 2A, the fins 20 are formed over the substrate 10 using, for example, a patterning process. The substrate 10 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 10 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

The fins 20 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The multi-patterning processes combining photolithography and self-aligned processes generally result in forming a pair of fins. In FIG. 2A, three fins 20 are illustrated. However, the numbers of the fins is not limited to three. In some embodiments, one or more dummy fins are formed adjacent to the fins 20 of an active FinFET.

In some embodiments, the entire fins 20 are formed of crystalline Si. In other embodiments, at least a channel region of the fins 20 includes SiGe where a content of Ge is in a range from about 20 atomic % to 50 atomic %. When a SiGe channel is employed, a SiGe epitaxial layer is formed over a substrate 10 and patterning operations are performed. In some embodiments, one or more buffer semiconductor layers having a lower Ge concentration than the channel region are formed over the substrate 10.

After the fins are formed, an isolation insulating layer 30 (e.g., shallow trench isolation (STI)), is disposed over the fins 20 and the substrate 10. Prior to forming the isolation insulating layer 30, one or more liner layers are formed over the substrate 10 and sidewalls of the bottom part of the fins 20, in some embodiments. In some embodiments, the liner layers include a first fin liner layer formed on the substrate 10 and sidewalls of the bottom part of the fins 20, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

In some embodiments, the isolation insulating layer 30 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 30 is formed by one or more layers of SOG, SiO, SiON, SiOCN or fluorine-doped silicate glass (FSG) in some embodiments.

After forming the isolation insulating layer 30 over the fins 20, a planarization operation is performed so as to remove part of the isolation insulating layer 30. The planarization operation may include a chemical mechanical polishing (CMP) and/or an etch-back process. Subsequently, portions of the isolation insulating layer 30 extending over the top surfaces of the fins 20, and portions of the liner layers over the top surfaces of the fins 20 are removed using, for example, an etch process, chemical mechanical polishing (CMP), or the like. Further, the isolation insulating layer 30 is recessed to expose the upper portion of the fins 20. In some embodiments, the isolation insulating layer 30 is recessed using a single etch process, or multiple etch processes. In some embodiments in which the isolation insulating layer 30 is made of silicon oxide, the etch process may be, for example, a dry etch, a chemical etch, or a wet cleaning process. In certain embodiments, the partially removing the isolation insulating layer 30 is performed using a wet etching process, for example, by dipping the substrate in hydrofluoric acid (HF). In another embodiment, the partially removing the isolation insulating layer 30 is performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

As shown in FIG. 2A, the fins 20 extend in the X direction and are arranged in the Y direction with an equal pitch P1. The width W1 of the fins 20 at this stage is in a range of about 5 nm to about 40 nm in some embodiments. In some embodiments, the width W1 of the fins 20 is in a range of about 7 nm to about 15 nm. The height H1 of the fins 20 measured from the upper surface of the isolation insulating layer 30 at this stage is in a range of about 50 nm to about 300 nm in some embodiments. In some embodiments, the height H1 of the fins 20 is in a range of about 50 nm to about 100 nm. The pitch P1 of the fins 20 is in a range of about 10 nm to about 90 nm in some embodiments. In some embodiments, the width of the fins 20 is in a range of about 14 nm to about 45 nm. The space between the fins 20 is in a range of about 5 nm to about 80 nm in some embodiments, and is in a range of about 7 nm to about 15 nm in other embodiments.

Figure 2C:
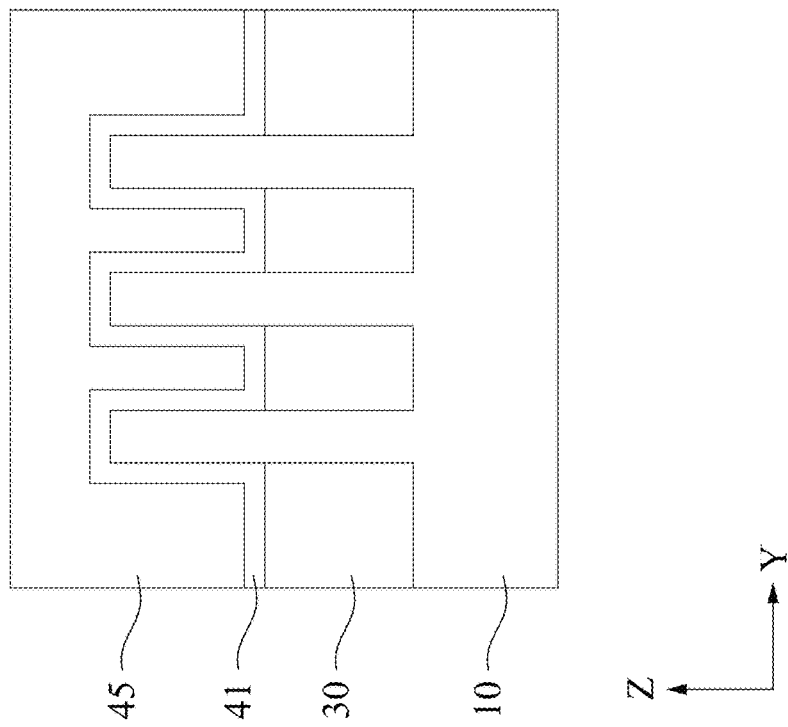
FIGS. 2B and 2C illustrate one of the various stages of a semiconductor device fabrication process in accordance with some embodiments of the present disclosure.
Figure 2B:
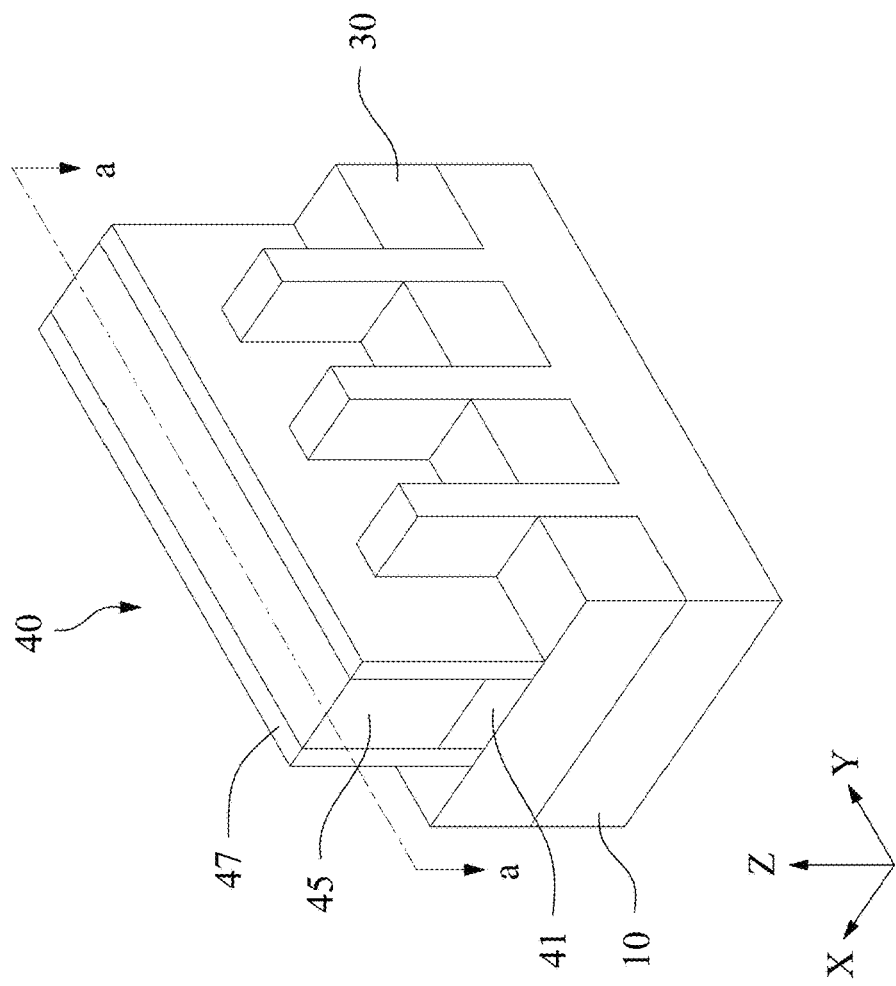

After the fins 20 and the isolation insulating layer 30 are formed, a sacrificial gate structure 40 including a sacrificial gate dielectric layer 41 and a sacrificial gate electrode layer 45 are formed over the exposed fins 20, which are subsequently used as channel layers of a gate region, as shown in FIGS. 2B and 2C. FIG. 2B is a perspective view and FIG. 2C is a cross sectional view corresponding to line a-a of FIG. 2B along the Y direction.

The sacrificial gate dielectric layer 41 and the sacrificial gate electrode layer 45 will be subsequently used to define and form the source/drain regions. In some embodiments, the sacrificial gate dielectric layer 41 and the sacrificial gate electrode layer 45 are formed by first depositing and patterning a sacrificial gate dielectric layer formed over the exposed fins 20 and then a dummy electrode layer over the sacrificial gate dielectric layer. The sacrificial gate dielectric layer 41 may be formed by thermal oxidation, CVD, sputtering, or any other methods known and used in the art for forming a sacrificial gate dielectric layer. In some embodiments, the sacrificial gate dielectric layer 41 is made of one or more suitable dielectric materials such as silicon oxide, silicon nitride, SiCN, SiON, and SiN; low-k dielectrics, such as carbon doped oxides; extremely low-k dielectrics, such as porous carbon doped silicon dioxide; a polymer, such as polyimide; the like, or a combination thereof. In some embodiments, $SiO_2$ is used.

Subsequently, the sacrificial gate electrode layer 45 is formed over the sacrificial gate dielectric layer 41. In some embodiments, the sacrificial gate electrode layer 45 is a conductive material and is selected from a group including amorphous silicon, poly silicon, amorphous germanium, poly germanium, amorphous silicon-germanium, poly silicon-germanium, metallic nitrides, metallic silicides, metallic oxides, and metals. The sacrificial gate electrode layer may be deposited by PVD, CVD, sputter deposition, or other techniques known and used in the art for depositing conductive materials. Other materials, conductive and non-conductive, may be used. In one embodiment, polysilicon is used.

A mask pattern may be formed over the sacrificial gate electrode layer 45 to aid in the patterning. The mask pattern includes a first mask layer and a second mask layer disposed on the first mask layer. The mask pattern includes one or more layers of $SiO_2$, SiCN, SiON, aluminum oxide, silicon nitride, or other suitable materials. In some embodiments, the first mask layer includes silicon nitride or SiON and the second mask layer includes silicon oxide. By using the mask pattern as an etching mask, the dummy electrode layer is patterned into the sacrificial gate electrode layer 45. In some embodiments, the dielectric layer is also patterned to define the sacrificial gate dielectric layer. The fins 20 extend in the X direction and the sacrificial gate structure 40 extends in the Y direction substantially perpendicular to the X direction. In FIGS. 2B and 2C, one sacrificial gate structure is illustrated. However, the number of the sacrificial gate structures is not limited to one.

Further, sidewall spacers 47 are formed on opposing sidewalls of the sacrificial gate structure 40, as shown in FIG. 2B. The sidewall spacers 47 include one or more dielectric layers. In one embodiment, the sidewall spacers 47 are made of one or more of silicon oxide, silicon nitride, SiOCN, SiCN, aluminum oxide, AlCO or AlCN, or any other suitable dielectric material. A blanket layer of a side-wall insulating material may be formed by CVD, PVD, ALD, or other suitable technique. Then, an anisotropic etching is performed on the side-wall insulating material to form a pair of side-wall insulating layers (sidewall spacers 47) on two main sides of the gate structure. The thickness of the side-wall insulating layers (sidewall spacers 47) is in a range of about 5 nm to about 30 nm in some embodiments, and in a range of about 10 nm to about 20 nm in other embodiments.

Figure 2D:
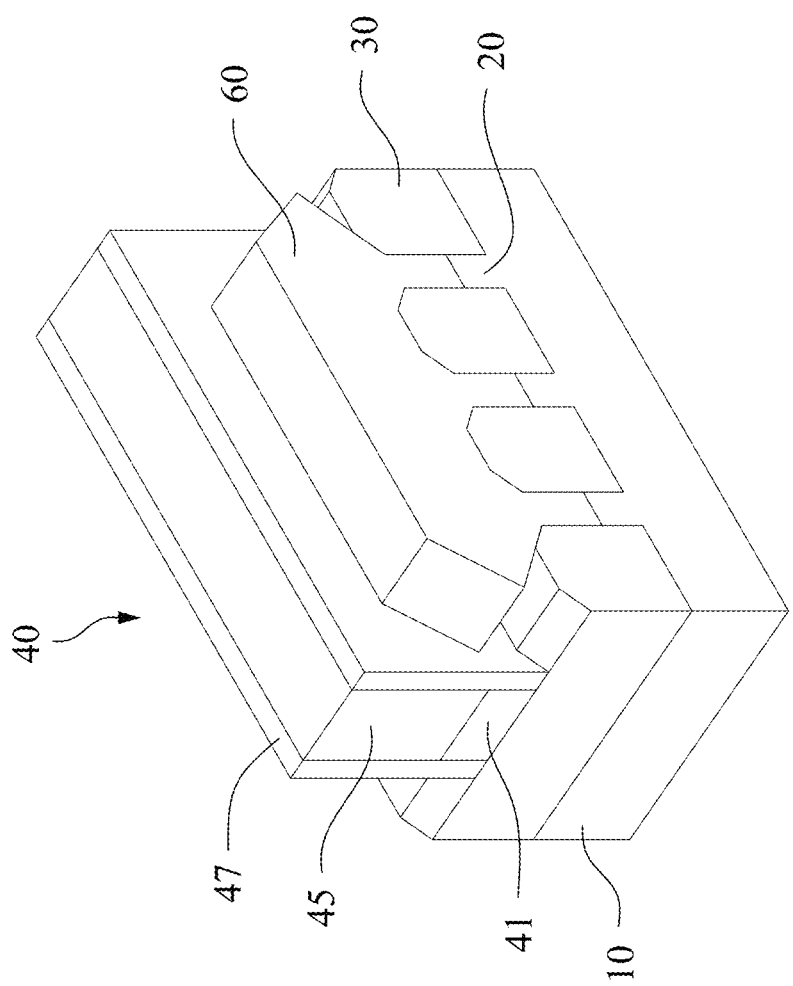
FIG. 2D illustrates one of the various stages of a semiconductor device fabrication process in accordance with some embodiments of the present disclosure.

Subsequently, source/drain regions of the fins 20 are recessed down below the upper surface of the isolation insulating layer 30. Then, a source/drain epitaxial layer 60 is formed over the recessed source/drain regions of the fins 20, as shown in FIG. 2D. In some embodiments, the source/drain epitaxial layer 60 is a merged epitaxial layer as shown in FIG. 2D. In other embodiments, the source/drain epitaxial layer 60 is individually formed over the recessed fins 20 without merging with the adjacent source/drain epitaxial layer.

The materials used for the source/drain epitaxial layer 60 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer 60 includes two or more epitaxial layers with different compositions and/or different dopant concentrations. The source/drain epitaxial layer 60 can be formed by CVD, ALD, molecular beam epitaxy (MBE), or any other suitable methods.

After the source/drain epitaxial layer 60 is formed, an interlayer dielectric (ILD) layer 50 is formed. In some embodiments, before forming the ILD layer, an etch stop layer (ESL) is formed over the source/drain epitaxial layer 60 and sidewall spacers 47. The ESL is made of silicon nitride or a silicon nitride-based material (e.g., SiON, SiCN or SiOCN). The materials for the ILD layer 50 include compounds comprising Si, O, C and/or H, such as silicon oxide, SiCOH and SiOC. Organic materials, such as polymers, may be used for the ILD layer 50.

Figure 2F:
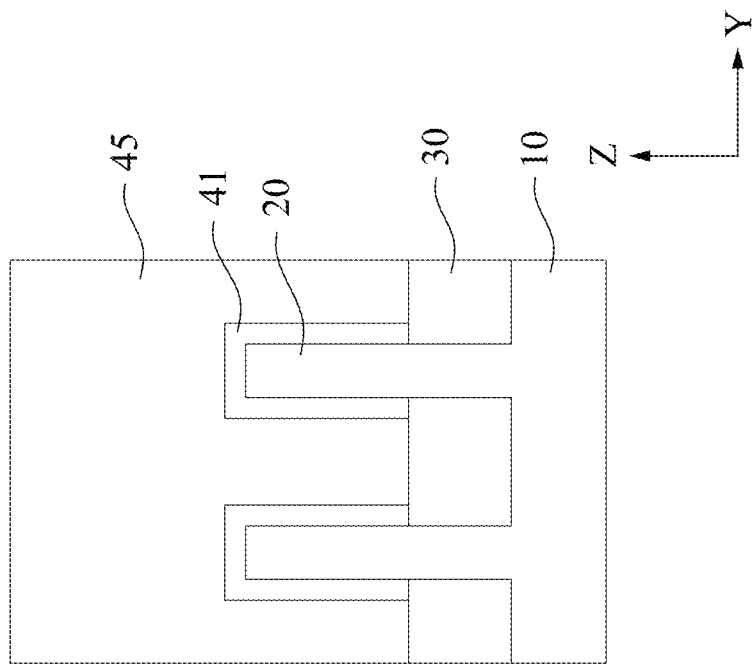
FIGS. 2E and 2F illustrate one of the various stages of a semiconductor device fabrication process in accordance with some embodiments of the present disclosure.
Figure 2E:
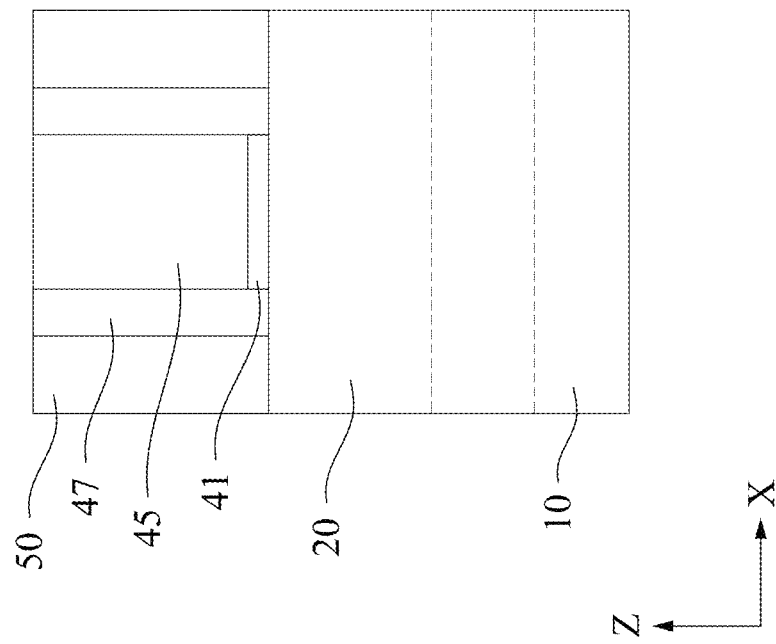

After the ILD layer 50 is formed, a planarization operation, such as an etch-back process and/or a chemical mechanical polishing (CMP) process, is performed to expose the upper surface of the sacrificial gate electrode layer 45, as shown in FIGS. 2E and 2F. FIG. 2E is a cross sectional view along the X direction, and FIG. 2F is a cross sectional view along the Y direction. In FIGS. 2F and 2H, only two fins 20 are illustrated for simplicity.

Figure 2G:
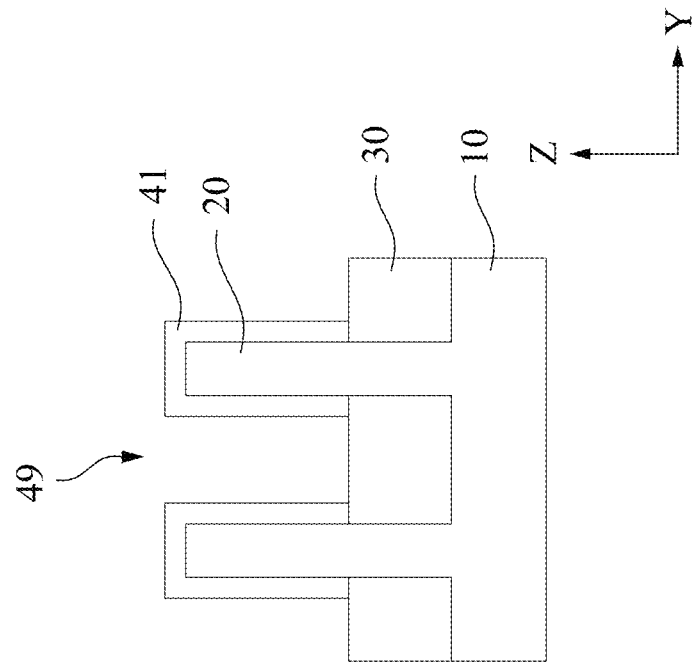
FIGS. 2G and 2H illustrate one of the various stages of a semiconductor device fabrication process in accordance with some embodiments of the present disclosure.
Figure 2H:
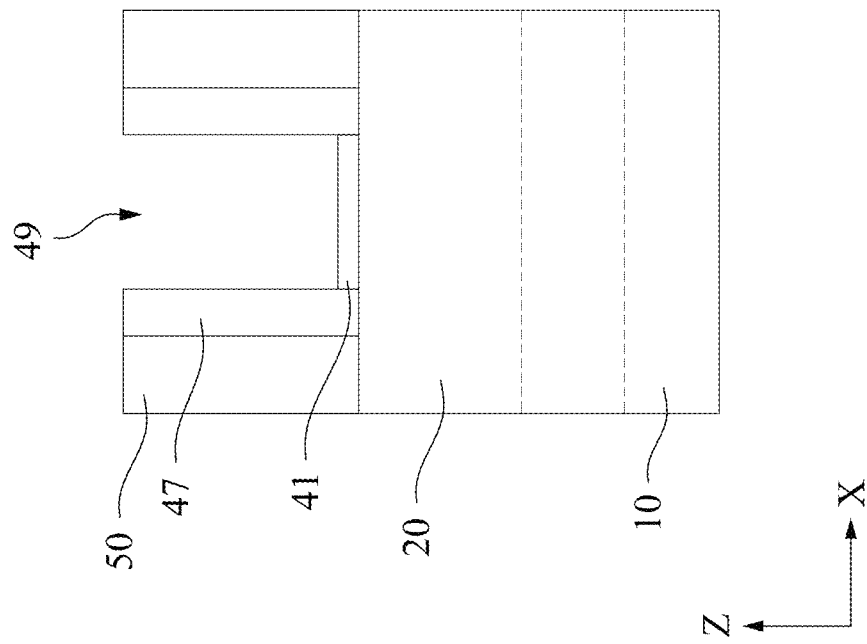

Then, as shown in FIGS. 2G and 2H, the sacrificial gate electrode layer 45 is removed, thereby forming a gate spacer 49. When the sacrificial gate electrode layer 45 is polysilicon and the ILD layer 50 is silicon oxide, a wet etchant such as a tetramethylammonium hydroxide (TMAH) solution can be used to selectively remove the sacrificial gate electrode layer. In some embodiments, as shown in FIG. 2G, a portion of the fin 20 below the gate spacer 49 which is between the source/drain regions of the fins 20 is selected and trimmed.

Figure 3A:
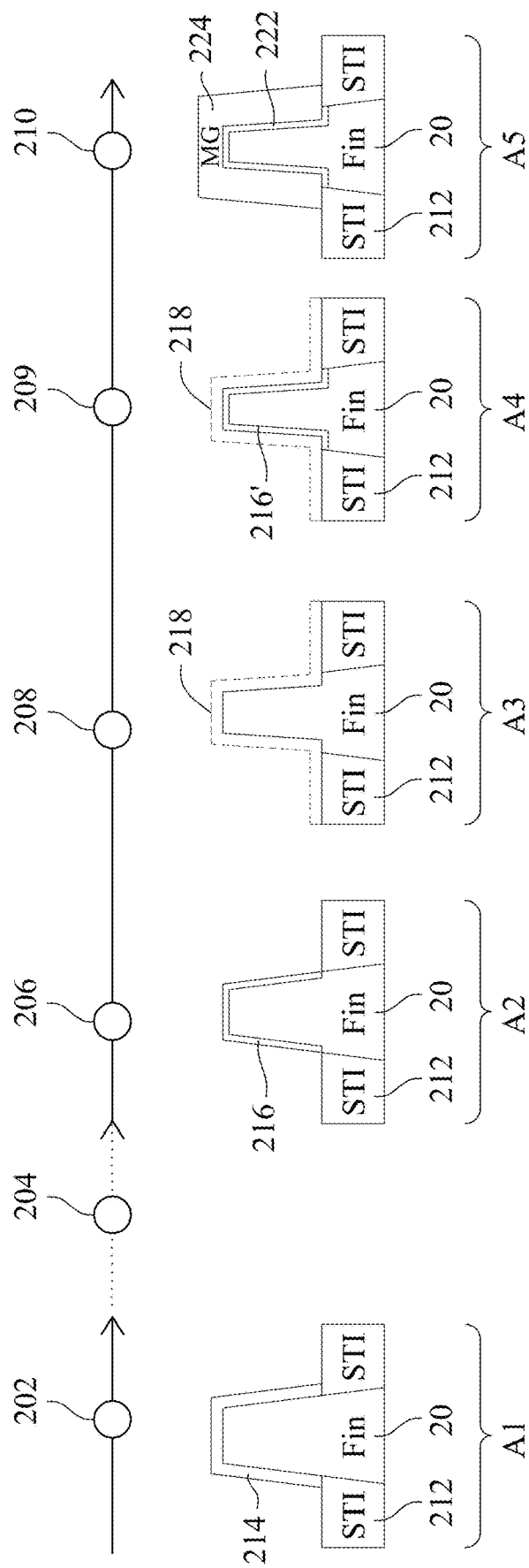
FIG. 3A illustrates the process steps of manufacturing a FinFET device in accordance with some embodiments of the present disclosure.

FIG. 3A illustrates the process steps of manufacturing a FinFET device in accordance with some embodiments of the present disclosure. At each step 202, 206, 208, 209, and 210, a corresponding semiconductor device A1, A2, A3, A4, or A5, having the fin 20 is shown. The semiconductor devices of FIG. 3A are a cross-sectional cut view through the fin 20 of FIG. 1A along the y-direction. At step 202, the fin 20 with the sacrificial gate dielectric layer 214 is exposed similar to FIG. 2H. In some embodiments, the top layer of the substrate 10 is an isolation insulating layer, e.g., an STI 212, consistent with isolation insulating layer 30 of FIGS. 1A, 1B, and 2A-2D, that the fin 20 protrudes from. The sacrificial gate dielectric layer 214 is consistent with the sacrificial gate dielectric layer 41, shown in FIGS. 2B-2H.

At step 204, the sacrificial gate dielectric 214 is removed, by an etching process, exposing a top surface of the fins 20 at the channel region.

At step 206, another sacrificial gate oxide layer 216 is formed over the channel region as shown in semiconductor device A2. Unlike the gate dielectric layer 214 that was deposited, the sacrificial gate oxide layer 216 is grown using the channel semiconductor material, e.g., Si, of the fin 20 by oxidizing semiconductor material. In some embodiments, $O_3$ is used to oxidize the fin 20. In other embodiments, a chemical oxidation using $NH_4OH+H_2O_2+H_2O$ (APM) is performed. In some embodiments, the thickness of the sacrificial gate oxide layer 216 is in a range from about 1 nm to about 2 nm. The thickness of the sacrificial gate oxide layer 216 can be adjusted by adjusting the oxidation conditions.

At step 208, the sacrificial gate oxide 216 is removed using a wet etch. In some embodiments, the sacrificial gate oxide 216 is removed from the sidewalls of the fin 20 making the fin 20 thinner from a top region to a bottom region of the fin 20. In addition, using the wet etch, the sacrificial gate oxide 216 is also removed from a top surface of the fin 20. The wet etch also removes a top portion of STI 212, because the STI 212 is also made of silicon oxide or a silicon oxide based insulating material. The wet etch removes more material from the bottom region than the top region of the fin 20, in some embodiments. The removal of the sacrificial gate oxide 216 from different regions of the fin 20 are described with respect to FIGS. 4A and 4B.

At step 209, another sacrificial gate oxide 216' is regrown on the fin, in some embodiments. In some embodiments, steps 208 and 209 are repeated until a predefined profile is achieved for the fin 20. Repeating the trimming steps 208 and 209 is described with respect to FIG. 3B. A line 218 shows a profile of the fin 20 and the STI 212 before the step 208 is performed and thus the line 218 illustrates how much of the fin 20 and the STI 212 are removed after performing the step 208. In some embodiments, the step 209 is not performed because the predefined profile is achieved at step 208.

At step 210, a gate dielectric layer 222, e.g., a high-k dielectric layer, is deposited on the fin 20. In some embodiments, an interfacial oxide layer is formed before forming the high-k gate dielectric layer. The interfacial oxide layer is formed by the similar operation to the sacrificial gate oxide layer 216. The high-k gate dielectric layer 222 can be formed by chemical vapor deposition (CVD), physical vapor deposition (PVD), atomic layer deposition (ALD), or any other suitable film formation methods. In addition, at step 210, a metal layer 224 as a gate electrode is deposited on the gate dielectric layer 222. In some embodiments, depending on a material of the metal layer 224, one or more work function adjustment layers are deposited between the metal layer 224 and the gate dielectric layer 222.

Figure 3B:
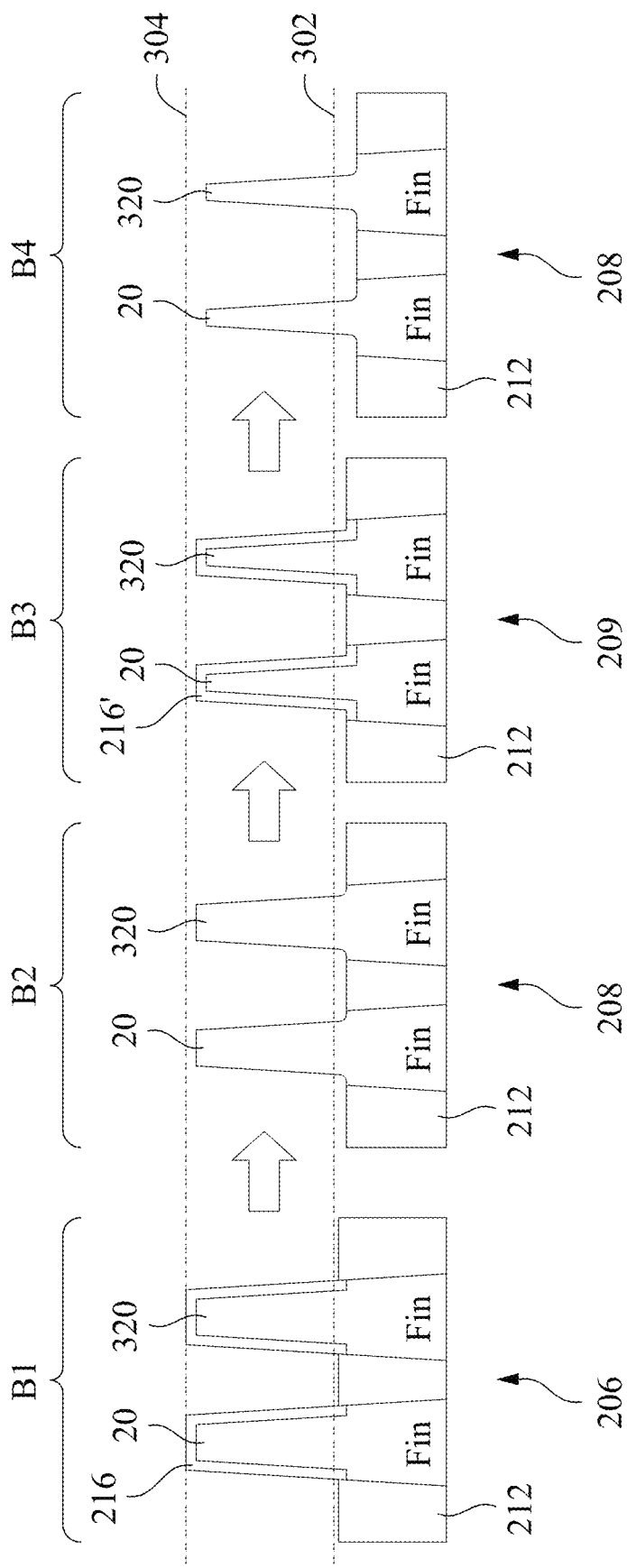
FIG. 3B illustrates the process steps of adjusting a fin profile of a FinFET device in accordance with some embodiments of the present disclosure.

FIG. 3B illustrates the process steps of adjusting a fin profile of an exemplary FinFET device in accordance with some embodiments of the present disclosure. FIG. 3B shows the fin 20 of FIG. 3A and an additional fin 320 adjacent to the fin 20 deposited on an isolation insulating layer such as STI 212 of FIG. 3A. In some embodiments, FIG. 3B includes semiconductor devices B1, B2, B3, and B4, which are cross-sectional cut views through the fins 20 of FIG. 1B along the y-direction. The fins 20 and 320 go through the same steps 208 and 209 described with respect to FIG. 3A. By performing the step 206, shown in semiconductor device B1, e.g., a FinFET device, the sacrificial gate oxide layer 216 is grown on the fins 20 and 320. The sacrificial gate oxide layer 216 is grown by oxidizing semiconductor material of the fins 20 and 320 using $O_3$ treatment that consumes a portion of the semiconductor material of the fin to form the oxide. By performing the step 208 for the first time, shown in semiconductor device B2, the sacrificial gate oxide layer 216 of the fins 20 and 320 are removed using wet etch and thus the fins 20 and 320 of semiconductor device B2 become narrower compared to the fins 20 and 320 of semiconductor device B1. As shown in FIG. 3B, the regrowth step 209 and the removal step 208 are performed one more time. By performing the step 209, shown in semiconductor device B3, the sacrificial gate oxide 216' is regrown on the fins 20 and 320. By performing the step 208 for the second time, shown in semiconductor device B4, the sacrificial gate oxide 216' of the fins 20 and 320 are removed using wet etch and thus the fins 20 and 320 of semiconductor device B4 become narrower compared to the fins 20 and 320 of semiconductor device B2. FIG. 3B also shows a top surface 302 of the STI 212 and a top surface 304 of the fins 20 and 320. In some embodiments, steps 209 and 208 are performed up to ten times e.g., five times, or until predefined profiles for the fins 20 and 320 are achieved.

As shown, in each step 208, in addition to narrowing the fins 20 and 320, the top surface of the fins 20 and 320 and the top surface of STI 212 are also etched, and the top surfaces 302 and 304 go down after each removal process. Thus, after performing the steps of FIG. 3B, the fins become shorter and narrower. However, since the top surface of the STI 212 is also etched, a height of the fins 20 and 320, defined from the top surface of the STI 212 to the top surface of the fins 20 and 320, does not substantially change, in some embodiments. In some embodiments, an etching rate R1 of the sacrificial gate oxide and an etching rate R2 of the STI 212 satisfy $0.9 < R1/R2 < 1.1$. When R1/R2 is one, the heights of the fins 20 and 320 are exactly maintained, otherwise, the heights are substantially maintained.

Figures 4A, 4B:
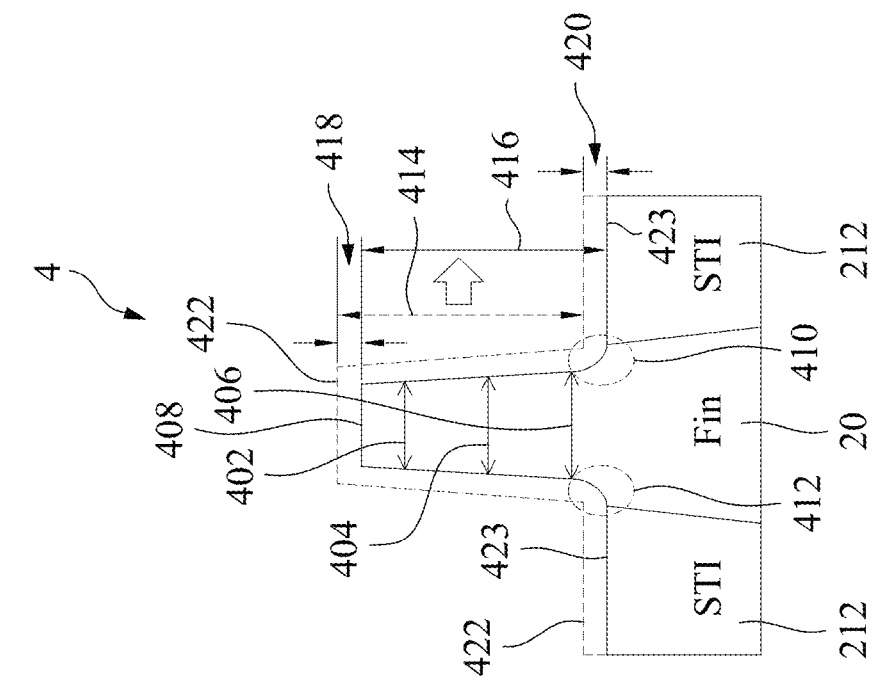
FIG. 4A illustrates an adjusted fin profile of a FinFET device in accordance with some embodiments of the present disclosure.
FIG. 4B illustrates a table of fin profile dimensions of an adjusted fin profile of a FinFET device in accordance with some embodiments of the present disclosure.

FIG. 4A illustrates an adjusted fin profile of a FinFET device in accordance with some embodiments of the present disclosure. A semiconductor device 4 of FIG. 4A that includes the fin 20 and the STI 212 illustrates parameters of the fin profile of the fin 20. The parameters of the fin profile of the fin 20 includes a top surface level 408 of the fin 20, a top indicator level 402 of the fin 20, a middle indicator level 404 of the fin 20, and a bottom indicator level 406 of the fin 20. A width of the fin 20 at top indicator level 402 is fin top CD (FinTCD), a width of the fin 20 at middle indicator level 404 is fin middle CD (FinMCD), and a width of the fin 20 at bottom indicator level 406 is fin bottom CD (FinBCD).

In some embodiments, a distance between the top surface level 408 and the top indicator level 402 of the fin 20 is between 10 percent and 15 percent, e.g., 12 percent, of the height of the fin 20, which the height of the fin 20 is a distance between the top surface 408 and a top surface 423 of the STI 212 after a STI height loss 420. A distance between the top surface level 408 and the middle indicator level 404 of the fin 20 is between 50 percent and 60 percent, e.g., 55 percent, of the height of the fin 20. A distance between the top surface level 408 and the bottom indicator level 406 of the fin 20 is between 85 percent and 100 percent, e.g., 90 percent, of the height of the fin 20.

In some embodiments, after the fin 20 is narrowed by applying the steps 208 and 209, the FinTCD is reduced by about 10 percent, the FinMCD is reduced by about 12 percent, and the FinBCD is reduced by about 15 percent.

As shown in FIG. 4A, semiconductor device 4 is consistent with a left portion of semiconductor device B4 that has fin 20 and has gone through steps 208 and 209 one or more times and the fin 20 is narrowed. For example, after narrowing the fin 20, a height between the top surface level 408 and top indicator level 402 is about 6 nm. Also, in some embodiments, a height between the top surface level 408 and the middle indicator level 404 is about 26 nm and a height between the top surface level 408 the bottom indicator level 406 is about 44 nm.

As shown in FIG. 4A, semiconductor device 4 shows an initial profile 422 of the fin 20 and the STI 212 after performing the trimming steps 208 and 209 to adjust, e.g., to trim or narrow, the fin 20. Also, the top surface of the fin 20 is reduced by a thickness, a fin top loss 418, which is about 2 percent of the fin height and the top surface of the STI 212 is reduced by a thickness, the STI height loss 420, which is also about 2 percent of the fin height, in some embodiments. Therefore, in some embodiments, a height of the fin 20, fin height 414, before performing the trimming steps 208 and 209, and a height of the fin 20, fin height 416, after performing the trimming steps 208 and 209, essentially stay the same. In some embodiments as shown in FIG. 4A, after performing the trimming steps 208 and 209 and narrowing the fin 20, a profile of the fin 20 includes two kink shapes, 410 and 412, at the right and left sides of the fin 20 next to the STI 212. The kink shape is described in more details with respect to FIGS. 4C and 4D. In some embodiments, the bottom indicator level 406 is at a bottom of the fin 20, which is the top surface 423 of the STI 212 after the STI height loss 420. In some embodiments, the bottom indicator level 406 is at the level of the initial profile 422 of the STI 212 before the STI height loss 420. Performance of the semiconductor device 4 before and after performing the trimming steps 208 and 209 and narrowing the fin 20, is described with respect to FIGS. 6A, 6B, 6C, and 6D.

FIG. 4B illustrates a table of fin profile parameters for an adjusted, e.g., trimmed, fin profile of an exemplary FinFET device in accordance with some embodiments of the present disclosure. The table T1 of FIG. 4B summarizes a change of the parameters of the profile of the fin 20 from before to after performing the trimming steps 208 and 209. The parameters of table T1 include the fin top loss 418, the STI height loss 420, and a change in fin height (Fin HT) from fin height 414 before trimming, to fin height 416 after trimming. In some embodiments, a measure of curvature, e.g., curvature radius, of the kink shape is used as a parameter. In some embodiments, a number of kink shapes or locations of the kink shapes are used as one or more parameters.

As shown, the height of the fin 20 is reduced by a fin top loss 418, which is between 1 percent and 2 percent of the height of the fin 20. Also, a top surface of the STI semiconductor is reduced by a STI height loss 420, which is also between 1 percent to 2 percent of the height of the fin 20 and thus the fin height 414 before narrowing, and the fin height 416 after narrowing have similar, e.g., comparable, heights. In addition, table T1 of FIG. 4B includes a change in the fin top CD (FinTCD), the fin middle CD (FinMCD), and the fin bottom CD (FinBCD) from before to after performing the trimming steps 208 and 209, one or more times. As shown, the fin top CD is reduced between 8 percent and 15 percent, the fin middle CD is reduced between 10 percent and 20 percent, and the fin bottom CD is reduced between 13 percent and 25 percent. Thus, in some embodiments, the fin 20 is trimmed more from bottom than the top. Also, table T1 of FIG. 4B includes measurement results, e.g., wafer acceptance tests (WAT), that are performed on the FinFETs that are fabricated. The measurements include a threshold voltage (Vt) measurement and a drain-induced barrier lowering (DIBL) measurement. The DIBL corresponds to a reduction of threshold voltage of the FinFET device at higher drain voltages. As shown in table T1, performing the trimming steps 208 and 209, improves a performance of the FinFET device by increasing the threshold voltage and reducing the DIBL. In some embodiments, the threshold voltage is around 0.45 volts before narrowing the fin profile; and after narrowing the fin profile the threshold voltage is increased by about 50 mV to 60 mV. In some embodiments, for a drain voltage range from 0.1 volts to 1.5 volts, the threshold voltage changes by about 90 my and thus the threshold voltage is reduced from 0.45 volts to about 0.36 volts and thus DIBL is about 90 mv. By using the fin profile narrowing described in FIG. 4B, the DIBL becomes between 70 mv and 75 mv instead of 90 mv and thus the threshold voltage changes from 0.45 volts to between 0.375 volts and 0.38 volts.

Figure 4D:
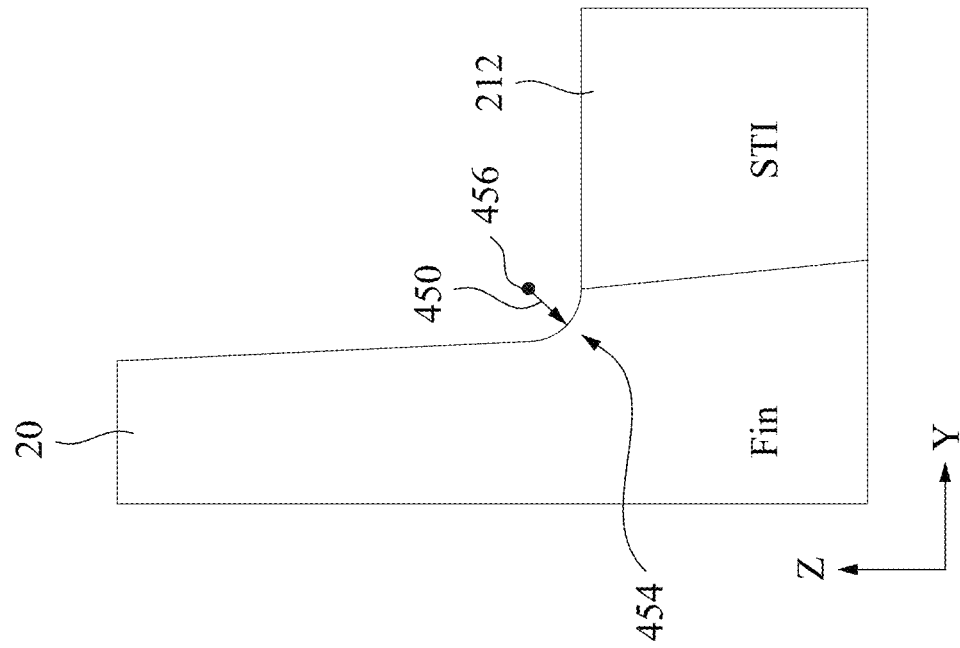
FIGS. 4C and 4D illustrate an enlarged portion of an adjusted fin profile of a FinFET device having a kink shape in accordance with some embodiments of the present disclosure.
Figure 4C:
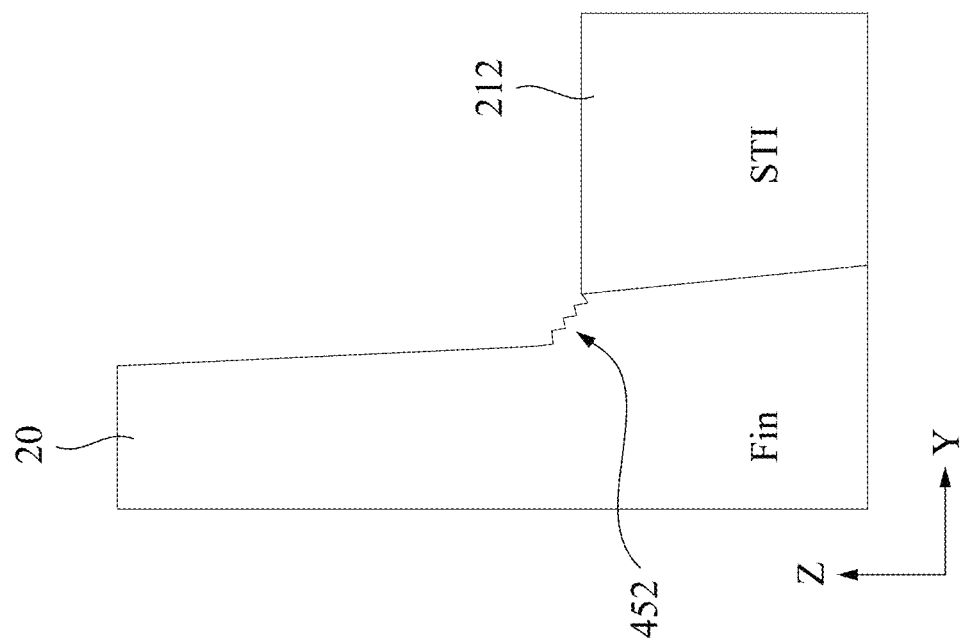

FIGS. 4C and 4D illustrate an enlarged portion of an adjusted fin profile of a FinFET device having a kink shape in accordance with some embodiments of the present disclosure. FIGS. 4C and 4D include a right portion of the semiconductor device in FIG. 4A, which has fin 20 and STI 212 and also includes a kink shape. In some embodiments, the kink shape 452 of FIG. 4C has a stepwise shape that connects between a vertical (parallel to z-direction) surface of fin 20 and a top surface of STI 212. The kink shape 452 includes two or more steps, depending on the number of trimming steps 208 and 209 performed. In some embodiments, two or more, e.g., ten, trimming steps 208 and 209 are performed and the kink shape 452 has ten steps. In some embodiments, the kink shape 452 extends between 3 nm to 7 nm in the z-direction and also extends between 3 nm to 7 nm in the y-direction as shown in FIG. 4C. In some embodiments, the kink shape 454 of FIG. 4D has an arc shape, e.g., a portion of a circle. The arc shape is centered around a point 456 and has a radius 450 which is between 5 nm to 10 nm. The arc shape connects between the vertical surface of fin 20 and the top surface of STI 212 as shown in FIG. 4D.

Figure 5:
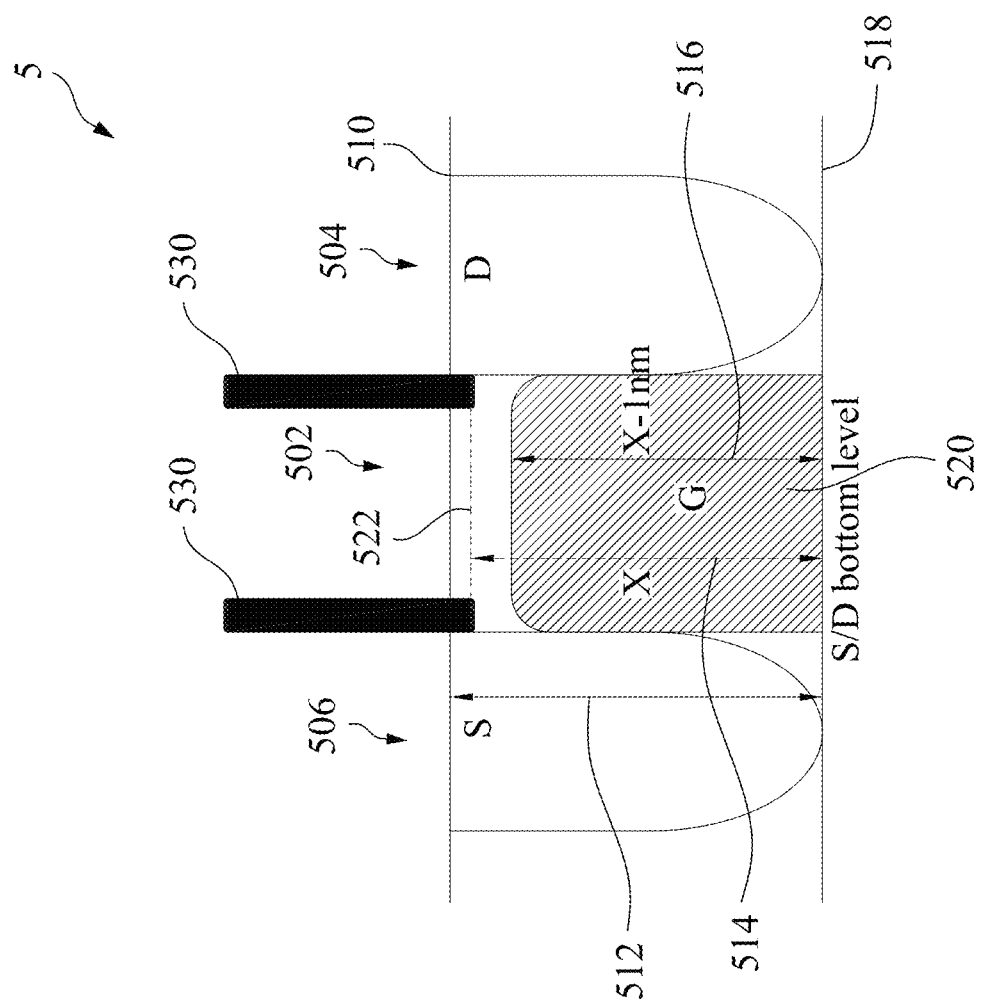
FIG. 5 illustrates a cross-sectional view of a fin of a FinFET device in accordance with some embodiments of the present disclosure.

FIG. 5 illustrates a cross-sectional view of a fin of an exemplary FinFET device, in accordance with some embodiments of the present disclosure. In some embodiments, FIG. 5 is a cross-sectional cut view 5 through the fin 20 of FIG. 1A along the x-direction. FIG. 5 includes channel region 502, drain region 504, and source region 506. In some embodiments, the source region 506, the channel region 502, and the drain region 504 are located on a fin consistent with the fin 20 of FIG. 1A that includes the channel region 22, the source region 32, and the drain region 34. In some embodiments, the channel region 502 has an initial height 514 (the initial height of fin 20) from source-drain bottom level, e.g., S/D bottom level 518, which is a bottom of the fin to a top surface 522, which is an initial top surface of the fin at the source and drain regions 506 and 504 and at the channel region 502. As described, the source region 506 and the drain region 504 are epitaxially grown around and over the source and drain regions 506 and 504 of the fin and over the initial top surface 522 of the fin, in some embodiments. Therefore, the source and drain regions 506 and 504 that epitaxially grow over the fin have a top surface 510, which is above the top surface 522 of a channel 520 at the channel region 502. In some embodiments, sidewall spacers 530 that are consistent with sidewall spacers 47 of FIG. 2G are disposed over the top surface 522 between the drain region 504 and the gate region 502 and also between the source region 506 and the gate region 502. As noted with respect to FIG. 3B, the channel region of the fins 20 and 320 go, one or more times, through the trimming steps 208 and 209 and thus the fin height at the channel region, after the trimming, is reduced to channel height 516. As shown in FIG. 5, the top surface 522 of the fin at the channel region 502 is etched and the channel height 516 after the trimming is reduced by about 2 percent of the initial height 514. In some embodiments, the source and drain regions 506 and 504 of the fin are covered by an interlayer dielectric layer, e.g., ILD layer 50 of FIG. 2G, during the trimming steps 208 and 209, however, the channel 520 of the fin in the channel region 502 is exposed and thus is etched. Therefore, in some embodiments, the top surface of the etched fin at the channel region 502 stays more than 1 nm lower that the top surface 510 of the source and drain regions 506 and 504. As described, a height 512 of the source and drain regions 506 and 504 between the S/D bottom level 518 and the top surface 510 is larger than the initial height 514 at the channel region 502 from S/D bottom level 518, which is a bottom of the fin to a top surface 522, in some embodiments. Thus, the height 512 is larger than the channel height 516 after trimming. Therefore, the source and drain regions 506 and 504 may not be in complete contact with a channel 520 at channel region 502 of the fin. In some embodiments as shown in FIGS. 2G and 5, sidewall spacers 47 and 530 between the gate region and the source and drain regions remains when the sacrificial gate electrode layer and the sacrificial gate dielectric layer are removed from the gate region. Thus, during the trimming steps 208 and 209, the sidewall spacers 530 remain. In some embodiments, after the trimming steps 208 and 209, another gate structure, e.g., a non-sacrificial gate structure, is disposed between the sidewall spacers 530 and over the gate region 502 of the fin, e.g., the fin 20 of FIG. 1A.

Figure 6A:
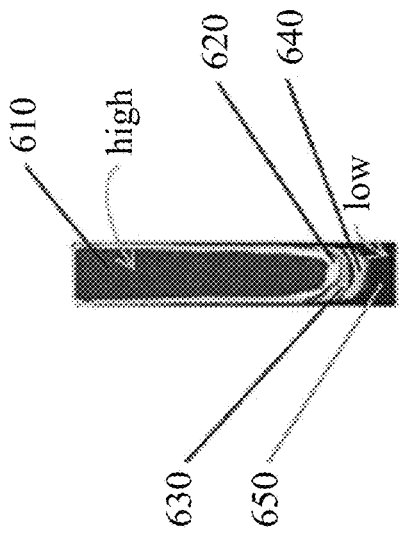
FIGS. 6A, 6B, 6C, and 6D illustrate current densities of fins of FinFET devices in accordance with some embodiments of the present disclosure.
Figure 6B:
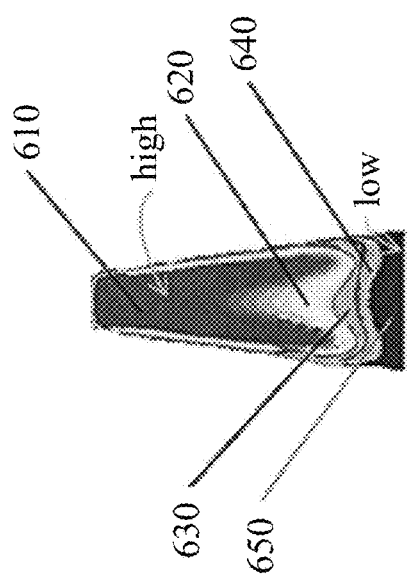
Figure 6C:
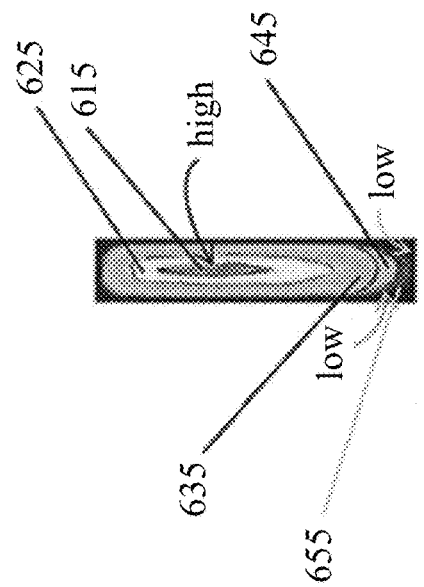
Figure 6D:
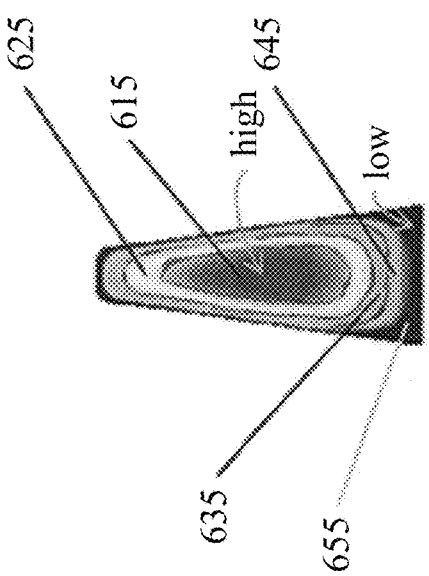

FIGS. 6A, 6B, 6C, and 6D illustrate current densities of fins of exemplary FinFET devices in accordance with some embodiments of the present disclosure. FIG. 6A shows current densities in an on-state of a wide fin of a FinFET device. FIG. 6B shows the current densities in the on-state of a narrow fin of a FinFET device. In FIGS. 6A and 6B, an area 610 may have a current density of $3.0 \times 10^7$ (relative value) an area 620 may have a current density of $2.4 \times 10^7$, an area 630 may have a current density of $1.8 \times 10^7$, an area 640 may have a current density of $1.1 \times 10^7$, and an area 650 may have a current density of $5.0 \times 10^5$. In FIGS. 6C and 6D, an area 615 may have a current density of $3.0 \times 10^2$, an area 625 may have a current density of $2.3 \times 10^2$, an area 635 may have a current density of $1.5 \times 10^2$, an area 645 may have a current density of $17.6 \times 10^1$, and an area 655 may have a current density of $1.0 \times 10^0$. The current densities are in amperes per square centimeters (A/cm$^2$) and, as shown, are distributed over the cross-sectional area of the fin. The cross-sectional area that is consistent with the cross-sectional area of fin 20 of FIGS. 2 and 3, is perpendicular to a direction between source and drain of the FinFET device.

FIGS. 6A and 6C show cross-sections perpendicular to x-direction of a fin that is consistent with the fin 20 of FIG. 1A having a trapezoid shape. FIG. 6C shows the current densities in an off-state of a wide fin of the FinFET device. FIG. 6A shows the current densities in an on-state of the FinFET device. As shown in FIGS. 6A and 6C, the total current in the off-state is considerably less than the total current in the on-state. As shown in FIGS. 6A and 6C, the current densities are far from being uniform.

FIGS. 6B and 6D also show cross-sections perpendicular to x-direction of a fin that is consistent with the fin 20 of FIG. 1A having a rectangular shape. FIG. 6D shows the current densities in an off-state of the FinFET device. FIG. 6B shows the current densities in an on-state of the FinFET device. The current densities that are in amperes per square centimeter are distributed over the cross-section area of FIGS. 6B and 6D. In some embodiments, the cross-sectional areas of FIGS. 6B and 6D are consistent with the cross-sectional areas of the trimmed fin 20 of semiconductor device B4 of FIG. 3B. As shown in FIG. 6D, the total current in the off-state is considerably less than the total current in the on-state as shown in FIG. 6B. Additionally, the off-state current of FIG. 4D is considerably less than the off-state current of FIG. 6C. As shown, the current density in FIG. 6B is essentially uniform in the fin. Thus, in some embodiments, by trimming a fin having a profile similar to FIGS. 6A and 6C to make the fin narrower to have a profile similar to FIGS. 6B and 6D; reduces the off-state current, e.g., the leakage current is reduced. Additionally, in the on-state, the current density inside the fin becomes more uniformly distributed.

Figure 7A:
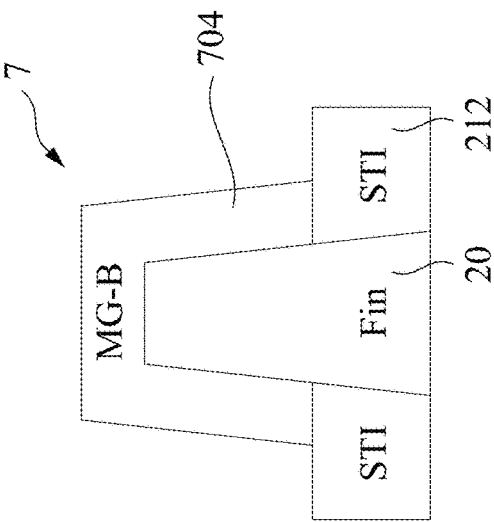
FIGS. 7A and 7B illustrate FinFET devices having two different gate electrodes with different work functions in accordance with some embodiments of the present disclosure.
Figure 7B:
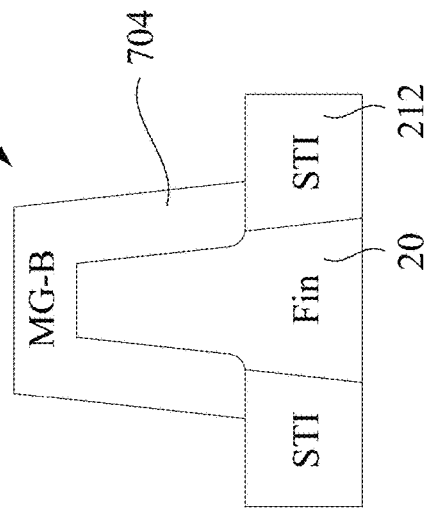

FIGS. 7A and 7B illustrate FinFET devices having two different gate electrodes with different work functions in accordance with some embodiments of the present disclosure. FIGS. 7A and 7B show semiconductor devices 6 and 7 that have fins 20 consistent with the fin 20 of the semiconductor device A1 in FIG. 3A, which is not trimmed. The gate structures 702 and 704 are consistent with the gate structure of the semiconductor device A5 at step 210 of FIG. 3A and include the gate dielectric layer 222 and the metal layer 224. In some embodiments, depending on a material of the metal layer 224, a work function adjustment layer (not shown) is deposited between the metal layer 224 and the gate dielectric layer 222. In some embodiments the metal layer of the semiconductor devices 6 and 7 are made of different metals and different work function adjustment layers. Thus, the threshold voltage of a FinFET device is modified by disposing different metal layers and work function adjustment layers for the metal layer.

Figure 7C:
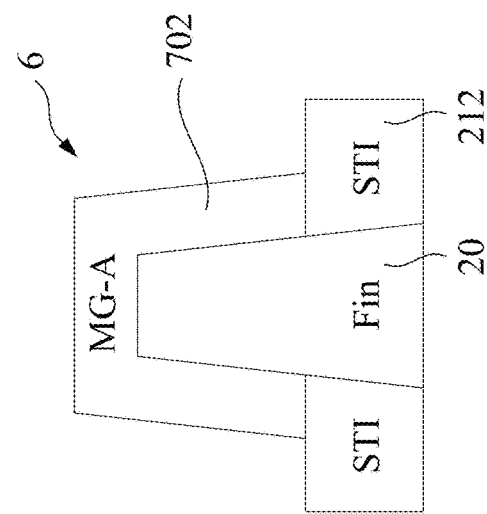
FIGS. 7C and 7D illustrate FinFET devices having two different gate electrodes with different work functions in accordance with some embodiments of the present disclosure.
Figure 7D:
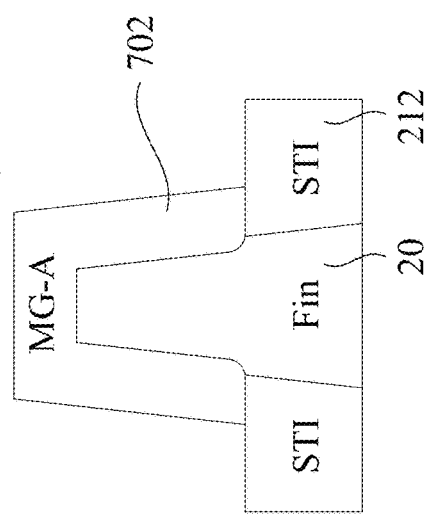

FIGS. 7C and 7D illustrate exemplary FinFET devices having two different gate electrodes with different work functions in accordance with some embodiments of the present disclosure. FIGS. 7C and 7D show semiconductor devices 8 and 9 that have fins 20 consistent with the trimmed fin 20 of the semiconductor device B4 in FIG. 3B. In some embodiments, the fin 20 is trimmed to have a predefined fin profile. The predefined fin profile is designed to produce a specific threshold voltage. By adjusting the number of repetitions of the steps 208 and 209 from one region to other regions, FinFET devices having different threshold voltages can be obtained. In some embodiments, in a first region, the trimming steps 208 and 209 are repeated a first number of times, e.g., four times, but in a second region, the trimming steps 208 and 209 are repeated a second number of times, e.g., five times. Referring back to FIG. 3B, the trimming steps 208 and 209 are repeated four times for the fin 320 but the trimming steps 208 and 209 are repeated five times for the fin 20. Assuming the fins 320 and 20 have the same initial profile, applying the trimming steps described above may result in a narrower fin profile for the fin 20 compared to the fin profile of fin 320. Thus the fins 320 and 20 may have different threshold voltages.

In some embodiments, photolithography is used and the sacrificial gate electrode layer 45 of FIG. 2F is patterned such that the sacrificial gate electrode layer 45 and the sacrificial gate dielectric layer 41 are removed from the left fin, which is consistent with fin 20 of FIG. 3B and the sacrificial gate electrode layer 45 and the sacrificial gate dielectric layer 41 remain over the right fin, which is consistent with fin 320 of FIG. 3B. Then, the trimming steps 208 and 209 are applied one or more times and the fin 20 is narrowed while fin 320 is not trimmed. Subsequently, the sacrificial gate electrode layer 45 and the sacrificial gate dielectric layer 41 are also removed from the right fin, which is consistent with fin 320 of FIG. 3B. Then, the trimming steps 208 and 209 are applied one or more times and the fins 20 and 320 are both narrowed. As a result, the trimming steps 208 and 209 are applied more times on the fin 20 than on the fin 320. In some embodiments, the number of times that the trimming steps 208 and 209 are applied on each one of the fins depends on the specific threshold voltage of that fin.

In some embodiments, the semiconductor devices 8 and 9 are consistent with the semiconductor device A5 at step 210 of FIG. 3A. In some embodiments, a gate structure 702 or 704 is disposed on the fin 20 of FIG. 7A or 7B, respectively. The gate structure 702 and 704 are consistent with the gate structure of the semiconductor device at step 210 of FIG. 3A and include the gate dielectric layer 222 and the metal layer 224. In some embodiments, depending on a material of the metal layer 224, a work function adjustment layer is deposited between the metal layer 224 and the gate dielectric layer 222. In some embodiments the metal layer of the semiconductor devices 8 and 9 are made of different metals and additionally different work function adjustment layers are disposed for the semiconductor devices 8 and 9. In some embodiments, the threshold voltage of a FinFET device is adjusted by: 1) trimming the fin of the FinFET device and 2) disposing different metal layers and work function adjustment layers for the metal layer. In some embodiments, at least one FinFET device includes a fin which is not subjected to the fin trimming operation as set forth above. In some embodiments, the gate dielectric layer 214 is used as the gate oxide, and in other embodiments, the gate dielectric layer 214 is removed and then a high-k gate dielectric layer is formed over the channel region.

Figure 8:
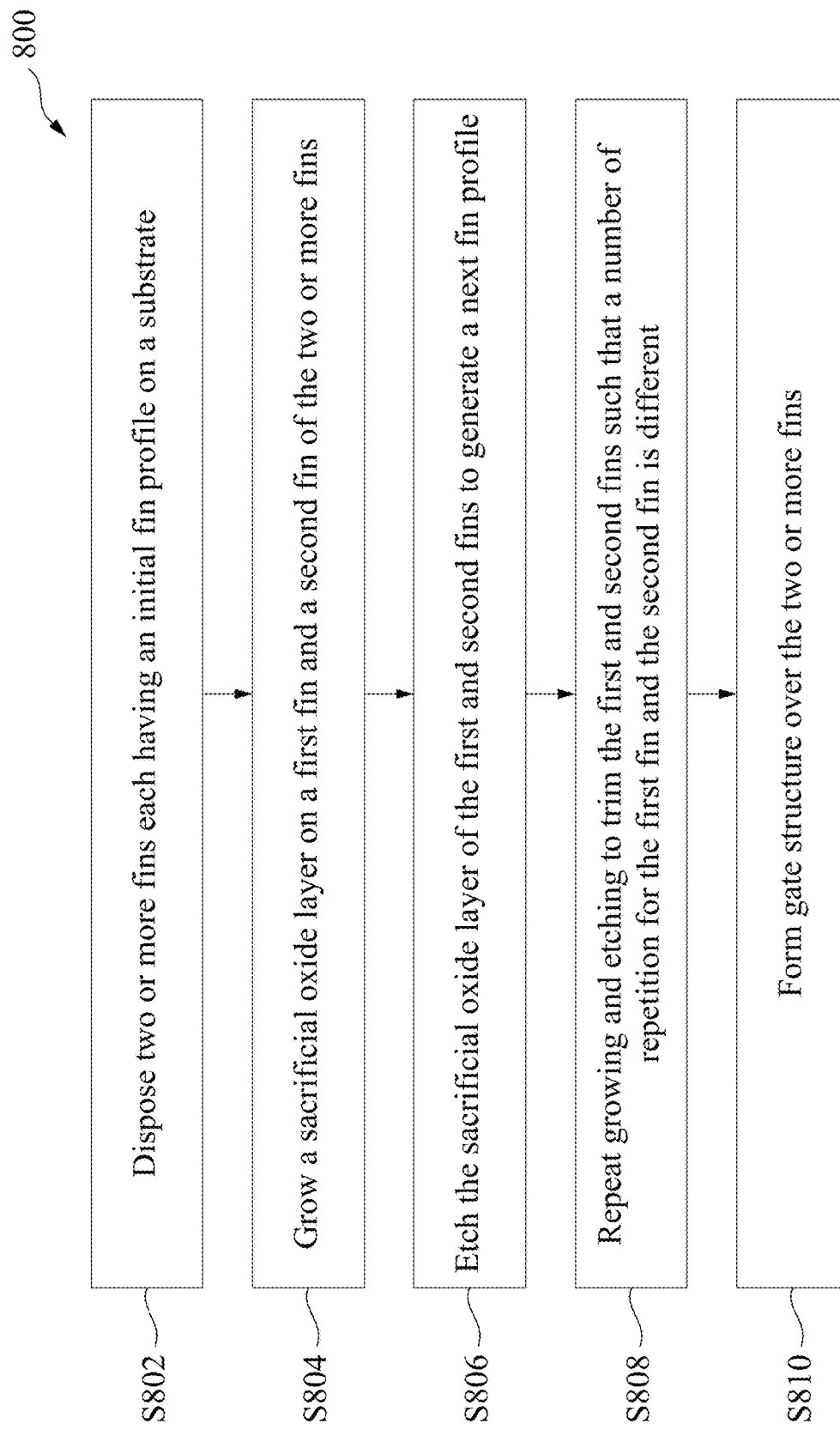
FIG. 8 schematically illustrates a process flow for adjusting the fin profile of FinFET device in accordance with some embodiments of the present disclosure.

FIG. 8 schematically illustrates a flow diagram of a method 800 for adjusting the fin profile of FinFET device in accordance with some embodiments of the present disclosure. The method includes the operation S802 of disposing two or more fins each having an initial fin profile on a substrate. For example, the fins 20 as shown in FIG. 1B may be disposed on the substrate 10. The fins have an initial profile as shown by the fins 20 or 320 in the semiconductor devices A1 of FIG. 3A and the semiconductor device B1 of FIG. 3B. Then, in operation S804, a sacrificial oxide layer is grown on a first fin and a second fin of the two or more fins. For example, as shown in the semiconductor device B1 of FIG. 3B, the sacrificial gate oxide layer 216 is grown on the fins 20 and 320. In some embodiments, the sacrificial gate oxide layer 216 is grown using ozone treatment and the growing consumes a portion of the semiconductor material of the fins 20 and 320 to form the gate oxide layer 216.

Then, in operation S806, the sacrificial oxide layer of the first and second fins is etched to generate a next fin profile. For example, as shown in the semiconductor device B2 of FIG. 3B, the sacrificial gate oxide layer 216 of the fins 20 and/or 320 are etched to create fins 20 and 320 of semiconductor device B2 of FIG. 3B that are narrower than the fins 20 and 320 of semiconductor device B1 of FIG. 3B.

In operation S808, the growing operation S804 and etching operation S806 are repeated to trim the first and second fins such that a number of repetition for the first fin and the second fin is different. In some embodiments, the number of repetitions for the first fin is a first predefined number and the number of repetitions for the second fin is a second predefined number different from the first predefined number. Therefore, starting from the same initial fin profile, the final fin profile of the first and second fins, after completing the corresponding repetitions, will not be the same. In operation S810, a gate structure is formed over the respective two or more fins. Forming the gate structure includes disposing a gate oxide layer or growing a gate oxide layer followed by disposing a gate electrode layer. In some embodiments, no ion implantation operation is performed on the channel region of the fin to adjust the threshold voltage.

In some embodiments, a fin profile of the fin 20 or 320 of FIG. 3B is tailored, e.g., trimmed, using an iterative fin trim process shown in FIG. 3B. Initially, a photolithography step is performed to select the fins that are to be trimmed. The selected fins are exposed, e.g., the sacrificial gate dielectric layer 214 and the sacrificial polysilicon are removed using, e.g., a wet etch step, and the fins not to be trimmed are kept covered with the sacrificial polysilicon and the gate dielectric layer 214. Then gate oxide layer 216 is grown using, e.g., an $O_3$ treatment. The $O_3$ treatment consumes a portion of the semiconductor material of the fin to form the oxide. Thus, when the grown oxide is etched using, e.g., a wet etch step, the fins 20 and 320 are trimmed. In some embodiments as shown in FIG. 3B, the gate oxide layer 216 is regrown using, e.g., an $O_3$ treatment and by repeating the etch-regrow-etch-regrow process, the fin profile is tailored until a predefined shape/size for the fin is obtained. In some embodiments, the predefined shape/size corresponds to a specific threshold voltage and thus the fin is trimmed until the specific threshold voltage is obtained for a FinFET device having that fin. In some embodiments, the predefined shape/size are defined based on the parameters defined with respect to FIGS. 4A and 4B. In some embodiments, the wet etch step is performed using a diluted HF (DHF) plus deionized $O_3$ water (DI $O_3$) etchant.

By using the method described in the present disclosure, the threshold voltage of FinFET devices can be modified, by modifying the CD of the fin. The presently disclosed method although does not use of ion implantation for adjusting the threshold voltage, nonetheless, the same mask (Vt implant mask) that is designed to select some of the fins for ion implantation and to cover some other fins, may be used for trimming the fins and thus can save cost because no new mask is used.

It will be understood that not all advantages have been necessarily discussed herein, no particular advantage is required for all embodiments or examples, and other embodiments or examples may offer different advantages.

According to some embodiments of the present disclosure, a method of manufacturing a semiconductor device includes disposing two or more fins each having an initial fin profile on a substrate and growing a sacrificial oxide layer on a first fin and a second fin of the two or more fins. The method further includes etching the sacrificial oxide layer of the first and second fins to trim the first and second fins and to generate a next fin profile for the first and second fins and repeating the growing and the etching to trim the first and second fins such that a number of repetitions of the growing and the etching for the first fin and the second fin is different. The method also includes forming gate structures over the two or more fins, respectively. In an embodiment, a first FinFET device includes the first fin and a second FinFET device includes the second fin, and the trimmed first and second fins provide different threshold voltages for the first FinFET device and the second FinFET device. In an embodiment, the number of repetitions for the first fin is one. In an embodiment, the two or more fins include a third fin that is not subject to the growing and the etching and is not trimmed, and the two or more fins include a fourth fin that is subject to the growing and the etching but is not subject to repeating the growing and the etching. In an embodiment, repeating the growing and the etching to trim the first fin produces a final fin profile for the first fin, and the final fin profile of the first fin compared to the initial fin profile of the first fin increases a threshold voltage for the first FinFET device. In an embodiment, parameters of a fin profile of each fin of the two or more fins include a first width of the fin at a top indicator level, a second width of the fin at a middle indicator level, and a third width of the fin at a bottom indicator level, and at least one of the first width, the second width, or the third width of the final fin profile of the first fin is smaller than a corresponding width of the initial fin profile of the first fin. In an embodiment, an isolation insulating layer is disposed on a top surface of the substrate and surrounds the two or more fins, and the etching etches the isolation insulating layer surrounding the two or more fins, and a height of the first fin measured from a top surface of the first fin to a top surface of the isolation insulating layer disposed around the first fin is substantially maintained between the initial fin profile of the first fin and the final fin profile of the first fin. In an embodiment, the final fin profile of the first fin includes a kink shape connecting a sidewall of each fin to a top surface of the isolation insulating layer, and the kink shape includes one of a stair shape, or an arc shape. In an embodiment, the trimming the first fin provides a first difference in the first width between the initial fin profile of the first fin and the final fin profile of the first fin, a second difference in the second width between the initial fin profile of the first fin and the final fin profile of the first fin, and a third difference in the third width between the initial fin profile of the first fin and the final fin profile of the first fin such that the third difference is larger than the second difference, and the second difference is larger than the first difference. In an embodiment, growing epitaxial layers at end portions of the first fin to generate source and drain regions and disposing source and drain contact on the source and drain regions. In an embodiment, oxidizing the first and second fins to grow the sacrificial oxide layer on the first and second fins and wet etching the sacrificial oxide layer of the first and second fins to generate the next fin profile. In an embodiment, the wet etching is performed using a dilute HF plus deionized $O_3$ water etchant, and the oxidizing is performed by ozone treatment.

According to some embodiments of the present disclosure, method for modifying a profile of a first fin and a second fin of corresponding first and second FinFET devices includes selecting a first region of the first fin and the second fin to be trimmed by selectively exposing the first region of the first fin and the second fin. The method also includes wet etching the exposed first region of the first fin and second fin to remove a first oxide disposed on the first region of the first fin and the second fin, oxidizing the exposed first region of the first fin and second fin to grow a second oxide, and repeating the wet etching and the oxidizing to trim the first fin and the second fin such that a number of repetitions of the wet etching and the oxidizing for the first fin and the second fin is different. In an embodiment, end portions of each fin are not included in the selected first region and forming a gate dielectric layer and a gate electrode layer around the selected region of the fin, growing epitaxial layers at the end portions of the fin to generate source and drain regions, and disposing source and drain contact on the source and drain regions. In an embodiment, the trimmed first and second fins provide different threshold voltages for the first FinFET device and the second FinFET device. In an embodiment, the wet etching is performed using a dilute HF plus deionized $O_3$ water etchant, and the oxidizing is performed by ozone treatment.

According to some embodiments of the present disclosure, a method of manufacturing a semiconductor device includes providing a fin structure by disposing two or more fins having an initial fin profile on a substrate. The method also includes growing a sacrificial oxide layer on the two or more fins, etching the sacrificial oxide layer of the two or more fins to trim the two or more fins and to generate a next fin profile for each one of the two or more fins, and repeating the growing and the etching to trim the two or more fins such that a number of repetitions of the growing and the etching for at least two fins of the two or more fins is different. The method further includes forming gate structures over the two or more fins, respectively. In an embodiment, a first FinFET device includes a first fin of the two or more fins and a second FinFET device includes a second fin of the two or more fins such that repeating the growing and the etching to trim the first fin and the second fin to produce a final fin profile for the first fin and the second fin that the final fin profile generates different threshold voltages for the first FinFET device and the second FinFET device. In an embodiment, the final fin profile of the first fin compared to the initial fin profile of the first fin generates a threshold voltage increase for the first FinFET device. In an embodiment, an isolation insulating layer is disposed on a top surface of the substrate and surrounds the two or more fins such that the final fin profile of the two or more fins includes one or more kink shapes connecting a sidewall of each fin to a top surface of the isolation insulating layer, and a kink shape includes one of a stair shape or an arc shape.

According to some embodiments of the present disclosure, a FinFET device includes a fin structure that include one or more fins that are disposed on a substrate. The fins include a first portion at the two ends of the fin and a second portion between the two ends of the fin. The second portion of at least one of the fins is trimmed to have a predefined shape, e.g., profile, to generate a specific threshold voltage for the FinFET. The first portion of the fin is not trimmed such that the second portion is narrower compared to the first portion. A gate structure is disposed on the second portion of the fin and source/drain structures are disposed on the first portion of the fin.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   disposing two or more fins that comprise at least first and second fins each having an initial fin profile on a substrate, wherein an isolation insulating layer is disposed over the substrate and the first and second fins protrude from the isolation insulating layer to expose the first and second fins, and wherein each of the first and second fins have source and drain regions at opposite ends of the fin and a gate region between the source and drain regions;
   growing epitaxial layers at the source and drain regions of the at least first and second fins;
   growing a sacrificial oxide layer on the gate region of the first fin and on the gate region of the second fin;
   etching the sacrificial oxide layer on the gate region of the first fin and the gate region of the second fins to trim the first and second fins and to generate a next fin profile for the first and second fins;
   continue trimming the gate regions of the first and second fins by repeating the growing and the etching of the first and second fins; and
   after the trimming:
   disposing a gate structure comprising a gate dielectric layer and a gate electrode layer over the gate region that has been trimmed, and disposing source and drain contacts on the source and drain regions to respectively produce first and second FinFET devices,
   wherein the trimming increases threshold voltages of the first and second FinFET devices, and wherein threshold voltage increases of the first and the second FinFET devices, caused by the trimming, are different from each other.

2. The method of claim 1, wherein the gate electrode layer includes one or more metal layers.

3. The method of claim 1, wherein the two or more fins include a third fin that is not subject to the growing and the etching and is not trimmed, and wherein the two or more fins include a fourth fin that is subject to the growing and the etching but is not subject to repeating the growing and the etching.

4. The method of claim 1, wherein the first FinFET device comprises the first fin of the two or more fins, and wherein repeating the growing and the etching to trim the first fin produces a final fin profile for the first fin, and wherein the final fin profile of the first fin compared to the initial fin profile of the first fin is configured to increase a threshold voltage of the first FinFET device between 50 mV and 60 mV.

5. The method claim 4, wherein the etching removes the isolation insulating layer surrounding the two or more fins, and wherein a height of the first fin measured from a top surface of the first fin to a top surface of the isolation insulating layer disposed around the first fin is substantially maintained between the initial fin profile of the first fin and the final fin profile of the first fin.

6. The method claim 5, wherein the final fin profile of the first fin includes a kink shape connecting a sidewall of each fin to a top surface of the isolation insulating layer, and wherein the kink shape comprises a stair shape having two or more steps.

7. The method of claim 4, wherein trimming the first fin produces:
a first difference in a first width between the initial fin profile of the first fin and the final fin profile of the first fin at a top of the first fin;
a second difference in a second width between the initial fin profile of the first fin and the final fin profile of the first fin at a bottom of the first fin where the first fin contacts the substrate; and
a third difference in a third width between the initial fin profile of the first fin and the final fin profile of the first fin at a mid-point of the first fin between the top and the bottom of the first fin,
wherein the third difference is larger than the second difference, and wherein the second difference is larger than the first difference.

8. A method of manufacturing a semiconductor device comprising:
selecting a first region of a first fin and a second region of a second fin, between opposite ends of the first and second fins, to be trimmed by selectively exposing the first regions of the first and the second fins, wherein the first and second fins are disposed on a substrate;
etching the exposed first regions of the first and second fins to remove a first oxide disposed on the first regions of the first and second fins;
oxidizing the exposed first regions of the first and second fins to grow a second oxide; and
continue trimming the first region of the first and second fins by repeating the etching and the oxidizing of the first and second fins, wherein the trimming produces a pair of stair shape kinks, comprising two or more steps, at both sides of each fin in the first region of each fin where the fin contacts the substrate,
wherein a number of steps of the pair of kink shapes of the first fin and a number of steps of the pair of kink shapes of the second fin are different.

9. The method of claim 8, the method further comprising:
forming a gate dielectric layer and a gate electrode layer around the selected first region of the first and second fins;
growing epitaxial layers at end regions of the first and second fins to generate source and drain regions; and
disposing source and drain contacts on the source and drain regions of the first and second fins.

10. The method of claim 8, wherein the trimmed first region of the first fin at a bottom of the first fin where the first fin contacts the substrate is wider than the trimmed first region of the second fin at a bottom of the second fin where the second fin contacts the substrate.

11. The method of claim 8, wherein the trimmed first region of the first fin is wider at a top of the first fin than the trimmed first region of the second fin at a top of the second fin.

12. The method of claim 8, wherein the etching is a wet etching that is performed using a dilute HF plus deionized Ch water etchant, and wherein the oxidizing is performed by ozone treatment.

13. The method of claim 8, wherein a number of repetitions of the etching and the oxidizing for the first fin is one and a number of repetitions of the etching and the oxidizing for the second fin is two.

14. The method of claim 8, wherein the etching is a dry etching using CHF3 or BF3 as etching gas.

15. A method of manufacturing a semiconductor device, comprising:
providing a fin structure by disposing at least first and second fins each having an initial fin profile on a substrate, wherein the initial fin profile comprises a width at a top of the fin, a width at a bottom of the fin where the fin contacts the substrate, and a width at a mid-point of the fin between the top and the bottom of the fin;
growing a sacrificial oxide layer on the at least first and second fins in a gate region between opposite end regions of each one of the at least first and second fins;
etching the sacrificial oxide layer of the at least first and second fins in the gate region to trim the at least first and second fins and to generate a next fin profile for each one of the at least first and second fins;
continue trimming at least the gate region of the at least first and second fins by repeating the growing and the etching of the at least first and second fins to reduce widths of the at least first and second fins, wherein after the trimming a variation of the width at one or more of the top, the bottom, and the mid-point are different; and
forming gate structures over the gate regions of the at least first and second fins.

16. The method of claim 15, further comprising:
growing epitaxial layers at source and drain regions, at opposite ends, of the first and second fins and disposing source and drain contacts on the source and drain regions to respectively produce first and second Fin-FET devices,
wherein the first FinFET device comprises the first fin and the second FinFET device comprises the second fin, and wherein repeating the growing and the etching to trim the first fin and the second fin to produce a first final fin profile for the first fin and a second final fin profile for the second fin, and wherein the first and second final fin profiles are configured to generate:
different threshold voltages for the first FinFET device and the second FinFET device.

17. The method of claim 16, wherein the first final fin profile of the first fin compared to the initial fin profile of the first fin is configured to generate:
a threshold voltage increase for the first FinFET device.

18. The method of claim 16, wherein an isolation insulating layer is disposed on a top surface of the substrate and surrounds the first and second fins, wherein the first and second final fin profiles of the first and second fins includes a pair of kink shapes, comprising either a stair shape having two or more steps or an arc shape, at both sides of each fin in the first region of each fin where the fin contacts the isolation insulating layer.

19. The method of claim 18, wherein a number of steps of the pair of kink shapes of the first fin and a number of steps of the pair of kink shapes of the second fin are different.

20. The method of claim 18, wherein a radius of the pair of kink shapes of the first fin and is different from a radius of the pair of kink shapes of the second fin.

* * * * *